(12) United States Patent
Kadota et al.

(10) Patent No.: US 12,273,091 B2
(45) Date of Patent: Apr. 8, 2025

(54) ACOUSTIC WAVE DEVICE

(71) Applicant: Murata Manufacturing Co., Ltd., Nagaokakyo (JP)

(72) Inventors: Michio Kadota, Sendai (JP); Shuji Tanaka, Sendai (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 853 days.

(21) Appl. No.: 17/487,340

(22) Filed: Sep. 28, 2021

(65) Prior Publication Data

US 2022/0014167 A1    Jan. 13, 2022

Related U.S. Application Data

(63) Continuation of application No. PCT/JP2020/010294, filed on Mar. 10, 2020.

(30) Foreign Application Priority Data

Mar. 29, 2019  (JP) ................. 2019-067024

(51) Int. Cl.
*H03H 9/02*  (2006.01)
*H03H 9/13*  (2006.01)

(52) U.S. Cl.
CPC .... *H03H 9/02157* (2013.01); *H03H 9/02015* (2013.01); *H03H 9/131* (2013.01)

(58) Field of Classification Search
CPC ..... H03H 9/0215; H03H 9/0201; H03H 9/131
See application file for complete search history.

(56) References Cited

U.S. PATENT DOCUMENTS

| | | | | |
|---|---|---|---|---|
| 2012/0286900 | A1* | 11/2012 | Kadota | H03H 9/542 333/195 |
| 2014/0175945 | A1* | 6/2014 | Kando | H10N 30/06 29/25.35 |
| 2017/0117872 | A1* | 4/2017 | Morton | G01N 29/022 |
| 2018/0226939 | A1 | 8/2018 | Inoue et al. | |

FOREIGN PATENT DOCUMENTS

| | | |
|---|---|---|
| JP | 2006-211589 A | 8/2006 |
| JP | 2010-021914 A | 1/2010 |
| JP | 2013-225945 A | 10/2013 |
| JP | 2015-228620 A | 12/2015 |
| JP | 2019-029987 A | 2/2019 |
| WO | 2013/031748 A1 | 3/2013 |
| WO | 2017/026257 A1 | 2/2017 |

OTHER PUBLICATIONS

Official Communication issued in International Patent Application No. PCT/JP2020/010294, mailed on Jun. 9, 2020.

* cited by examiner

*Primary Examiner* — Derek J Rosenau

(74) *Attorney, Agent, or Firm* — Keating & Bennett, LLP

(57) ABSTRACT

An acoustic wave device includes a support substrate, a piezoelectric body including LiTaO₃, a first electrode on a first main surface of the piezoelectric body, a second electrode on a second main surface, an acoustic-layer laminated body between a support substrate and the piezoelectric body. The azimuth angle of the piezoelectric body is (about 85° to 95°, about 85° to 95°, about 5° to 65°) represented in Euler angles.

22 Claims, 25 Drawing Sheets

ACOUSTIC WAVE DEVICE

CROSS REFERENCE TO RELATED APPLICATIONS

This application claims the benefit of priority to Japanese Patent Application No. 2019-067024 filed on Mar. 29, 2019 and is a Continuation Application of PCT Application No. PCT/JP2020/010294 filed on Mar. 10, 2020. The entire contents of each application are hereby incorporated herein by reference.

BACKGROUND OF THE INVENTION

1. Field of the Invention

The present invention relates to an acoustic wave device including a support substrate, an acoustic layer, and a piezoelectric body that are laminated together.

2. Description of the Related Art

In the related art, various acoustic wave resonators that use bulk waves have been proposed. In an acoustic wave resonator described in Japanese Unexamined Patent Application Publication No. 2015-228620, a piezoelectric body is laminated on an acoustic multilayer film. The operation of the acoustic wave resonator at a higher frequency is achieved by reducing the thickness of the piezoelectric body.

The frequency bands used by smartphones and the like include a large number of communication bands. These communication bands are close to one another. Thus, there has been a demand for band-pass filters and multiplexers having steep frequency characteristics. In the related art, ladder filters have been used in order to obtain such characteristics. In a ladder filter, a plurality of SAW resonators and acoustic wave resonators using bulk waves are connected to each other so as to form a ladder circuit. In such a ladder filter, such a multiplexer, or the like, a resonator that is used is required to have a high Q in order to obtain steep frequency characteristics. However, it is difficult to increase Q to be sufficiently high in an acoustic wave resonator of the related art that uses a bulk wave.

SUMMARY OF THE INVENTION

Preferred embodiments of the present invention provide acoustic wave devices that are each able to improve Q by increasing the impedance ratio of the resonator.

Q is strongly correlated with the impedance ratio of a resonator, and thus, the following description uses the impedance ratio of a resonator.

An acoustic wave device according to a preferred embodiment of the present invention includes a support substrate, a piezoelectric body including a first main surface and a second main surface facing each other and that is made of $LiTaO_3$, a first electrode on the first main surface of the piezoelectric body, a second electrode on the second main surface of the piezoelectric body, and an acoustic-layer laminated body between the support substrate and the piezoelectric body. An azimuth angle of the piezoelectric body is (about 85° to 95°, about 85° to 95°, about 5° to 65°) represented in Euler angles.

An acoustic wave device according to a preferred embodiment of the present invention includes a support substrate, a piezoelectric body including a first main surface and a second main surface facing each other and that is made of $LiTaO_3$, a first electrode on the first main surface of the piezoelectric body, a second electrode on the second main surface of the piezoelectric body, and an acoustic-layer laminated body between the support substrate and the piezoelectric body. An azimuth angle of the piezoelectric body is (about −10° to 10°, about 62° to 90°, about 0° to 3°) or (−10° to 10°, 62° to 90°, 165° to 180°) represented in Euler angles.

An acoustic wave device according to a preferred embodiment of the present invention includes a support substrate, a piezoelectric body including first main surface and a second main surface facing each other and that is made of $LiNbO_3$, a first electrode on the first main surface of the piezoelectric body, a second electrode on the second main surface of the piezoelectric body, and an acoustic-layer laminated body between the support substrate and the piezoelectric body. An azimuth angle of the piezoelectric body is (about −10° to 10°, about −121° to −77°, about 0° to 45°) or (about −10° to 10°, about −121° to −77°, about 140° to) 180° represented in Euler angles.

In each of acoustic wave devices according to preferred embodiments of the present invention, the impedance ratio of a resonator is able to be increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to clarify the present invention.

The preferred embodiments described in the present specification are examples, and the configurations according to the different preferred embodiments may be partially replaced or combined with one another.

First Preferred Embodiment

Figure 1:
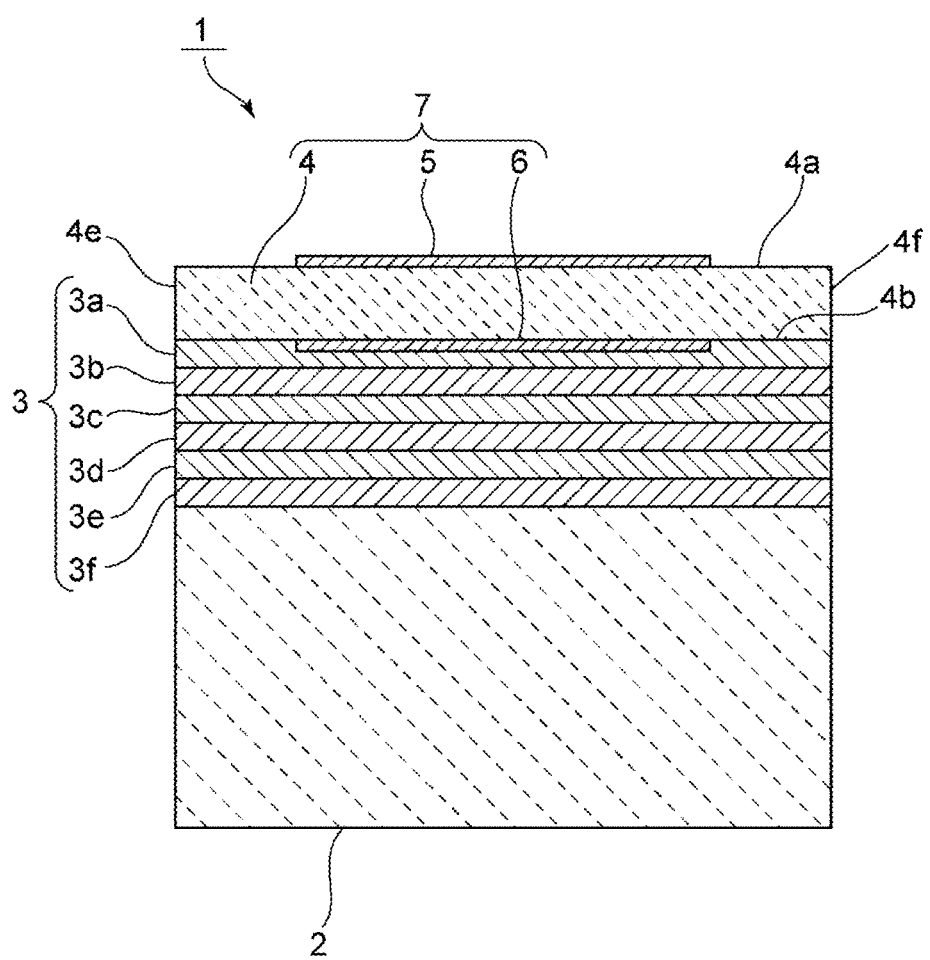
FIG. 1 is a sectional front view illustrating an acoustic wave device according to a first preferred embodiment of the present invention.
Figure 2:
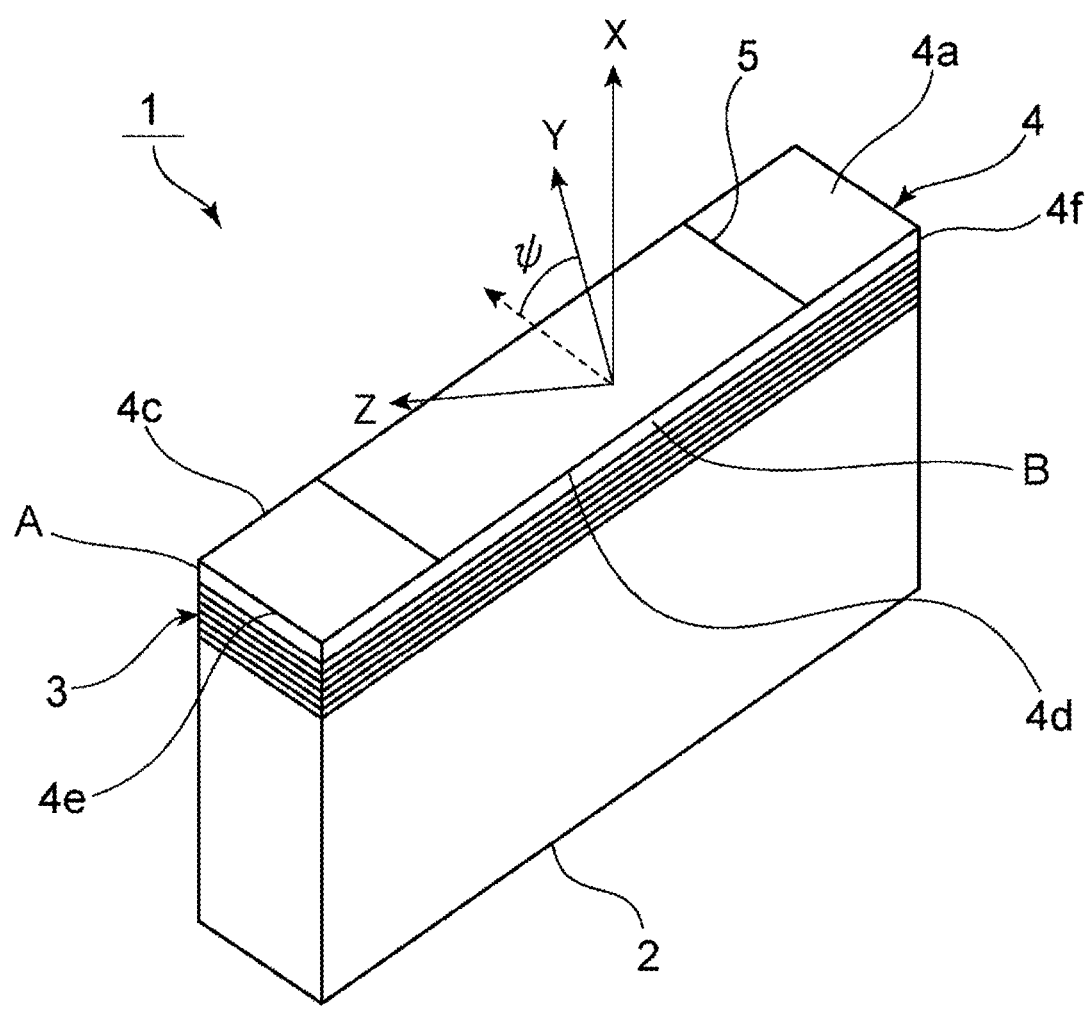
FIG. 2 is a perspective view illustrating the appearance of the acoustic wave device according to the first preferred embodiment of the present invention.

FIG. 1 is a sectional front view illustrating an acoustic wave device according to the first preferred embodiment of the present invention, and FIG. 2 is a perspective view illustrating the appearance of the acoustic wave device.

An acoustic wave device 1 includes a support substrate 2. A resonator 7 is disposed on the support substrate 2. The resonator 7 includes an acoustic-layer laminated body 3, a piezoelectric body 4, and first and second electrodes 5 and 6.

The acoustic-layer laminated body 3 includes a plurality of acoustic layers 3a to 3f. In the present preferred embodiment, the plurality of acoustic layers are laminated such that the acoustic layers 3a, 3c, and 3e that are low-acoustic-impedance layers each having a relatively low acoustic impedance and the acoustic layers 3b, 3d, and 3f that are high-acoustic-impedance layers each having a relatively high acoustic impedance are alternately laminated together. The resonator 7 includes the piezoelectric body 4 that is a piezoelectric thin plate using, for example, $LiTaO_3$ or $LiNbO_3$. The piezoelectric body 4 has an elongated strip shape. The piezoelectric body 4 includes first and second main surfaces 4a and 4b that face each other. A first electrode 5 is disposed on the first main surface 4a of the piezoelectric body 4. A second electrode 6 is disposed on the second main surface 4b of the piezoelectric body 4 so as to face the first electrode 5. In addition, virtual grooves A and B sandwich the first electrode 5 and the second electrode 6, and the depth of each of these grooves A and B is equal to or larger than the thickness of the piezoelectric body 4. Note that the virtual grooves A and B are, for example, the groove A and the groove B that are provided in a piezoelectric body that have a width larger than that of the piezoelectric body 4 illustrated in FIG. 2 so as to obtain the piezoelectric body 4. In this case, the inner side surfaces of the grooves A and B define and function as side surfaces 4c and 4d of the obtained piezoelectric body 4. In the present preferred embodiment, the groove A and the groove B extend to the support substrate 2.

In the acoustic wave device 1, the structure in which the support substrate 2 and the resonator 7 are laminated together has the strip shape illustrated in FIG. 2 and is elongated in a direction parallel or substantially parallel to the groove A and the groove B. In this case, in the resonator 7, since the Euler angles of the piezoelectric body 4 are set within the above-described range, when an alternating-current electric field is applied between the first electrode 5 and the second electrode 6, a bulk wave is excited, and the piezoelectric body 4 vibrates in a shear mode. Then, the resonance characteristics in the shear mode are obtained. The acoustic layers 3a, 3c, and 3e, which are low-acoustic-impedance layers, and the acoustic layers 3b, 3d, and 3f, which are high-acoustic-impedance layers, are alternately laminated together in this order starting from the side closer to the piezoelectric body 4. Thus, the excited bulk wave can be effectively confined within the piezoelectric body 4.

Figure 3:
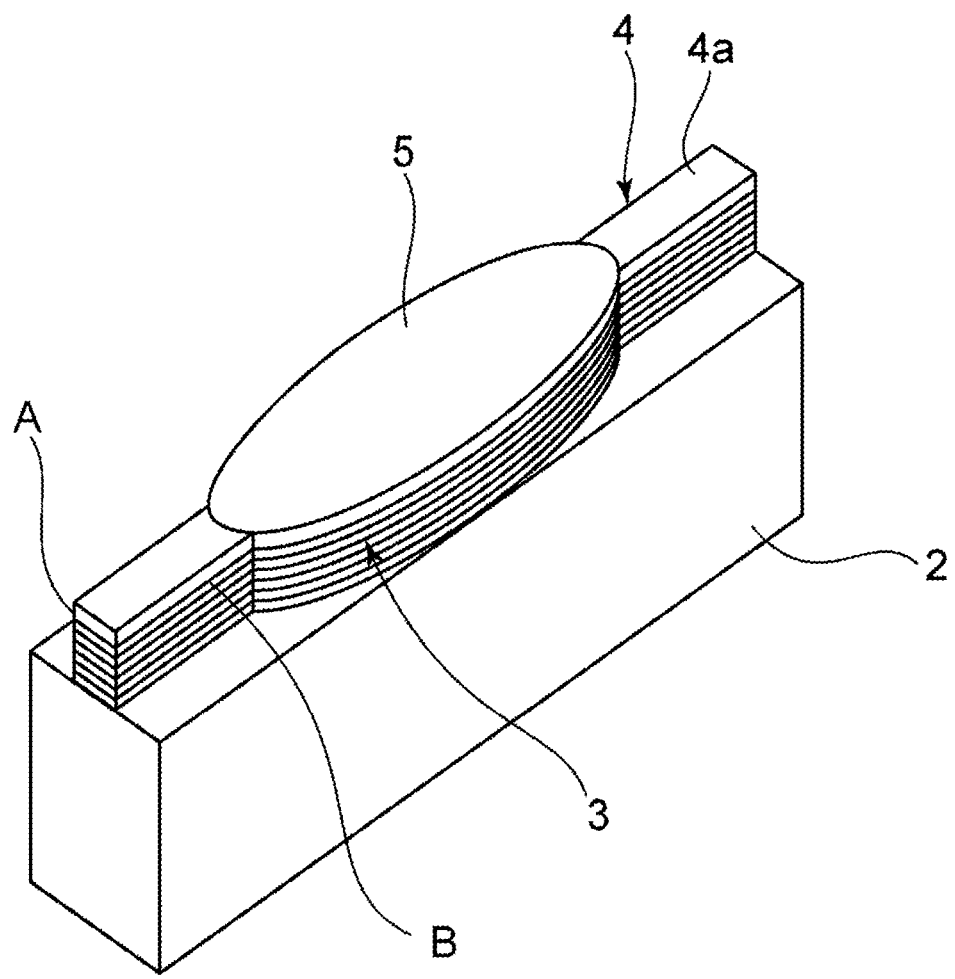
FIG. 3 is a perspective view illustrating a first modification of the first preferred embodiment of the present invention.

In preferred embodiments of the present invention, the piezoelectric body and the first and second electrodes are not limited to having a strip shape and may each have a rectangular or substantially rectangular shape, a polygonal or substantially polygonal shape, a circular or substantially circular shape, an elliptical or substantially elliptical shape, or the like, for example. For example, in a first modification of a preferred embodiment of the present invention that is illustrated in FIG. 3, the first electrode 5 has an elliptical or substantially elliptical shape. Note that the piezoelectric body 4 is formed by preparing a piezoelectric body that has a width larger than that of the piezoelectric body 4 and forming the virtual grooves A and B in the piezoelectric body such that the grooves A and B sandwich the first electrode 5 and the second electrode 6. Thus, the inner side walls of the grooves A and B define and function as the side surface 4c and 4d of the piezoelectric body 4. That is to say, the grooves A and B extend in the direction in which the side surface 4c and 4d extend. Since the first electrode 5 has an elliptical or substantially elliptical shape in plan view, the grooves A and B each have a nonlinear shape.

Figure 4:
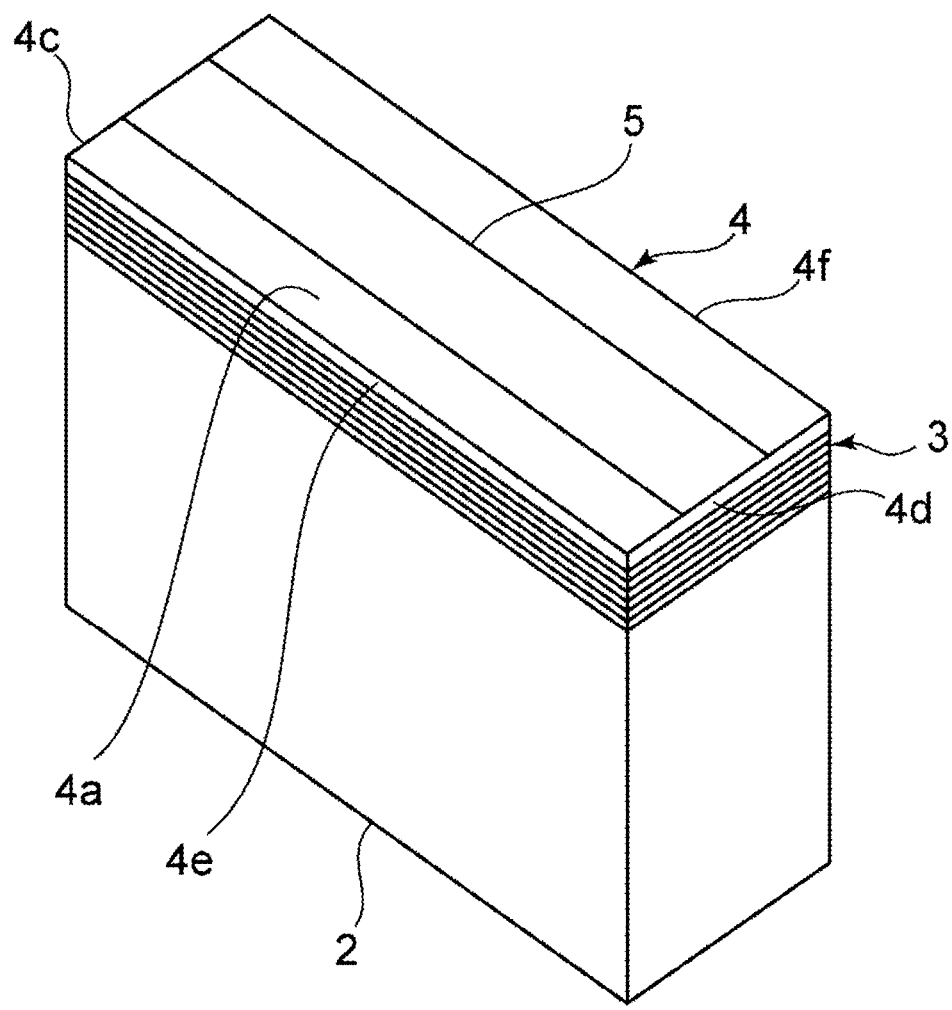
FIG. 4 is a perspective view illustrating a second modification of the first preferred embodiment of the present invention.

In the first preferred embodiment, the piezoelectric body 4 includes the side surfaces 4c and 4d and end surfaces 4e and 4f. The side surfaces 4c and 4d extend in the lengthwise direction of the first and second electrodes 5 and 6. The end surfaces 4e and 4f are parallel or substantially parallel to the widthwise direction of the first and second electrodes 5 and 6. In this case, as in a second modification of a preferred embodiment of the present invention that is illustrated in FIG. 4, in the piezoelectric body 4, the length of each of the side surfaces 4c and 4d, that is, the dimension of each of the side surfaces 4c and 4d along the lengthwise direction of the first and second electrodes 5 and 6, may be smaller than the dimension of each of the end surfaces 4e and 4f along the widthwise direction of the first and second electrodes 5 and 6.

A feature of the acoustic wave device 1 is that the azimuth angle of the piezoelectric body 4 using LiTaO$_3$ is within a range of (about 85° to 95°, about 85° to 95°, about 5° to 65°) in the Euler angles. As a result, an acoustic wave resonator that uses a bulk wave and in which the impedance ratio of a resonator is large can be provided. This matter will now be described based on the following specific experimental example. Note that, in the present specification, the Euler angles (about 90°, about 90°, about 0°) represent the Y direction on an X-cut plate, or a YZ plane, that is, the first electrode surface, and when viewed in plan view in the thickness direction of the piezoelectric body 4, the Euler angles (about 90°, about 90°, φ) illustrated in FIG. 2 indicate that the angle from the Y-axis is φ when a direction that is perpendicular or substantially perpendicular to the groove A or the groove B (the side on which the electrodes are disposed) function as a reference. Note that, in the case where each of the grooves does not have a linear shape, the angle from the Y-axis in a direction perpendicular or substantially perpendicular to the intercept at the midpoint of the length of each groove is T.

The materials and the dimensions of the acoustic wave device 1 were set as follows.

Support substrate 2: Si

Acoustic-layer laminated body 3:
  Acoustic layers 3a, 3c, and 3e serving as low-acoustic-impedance layers: Al layers each having a thickness of about 0.34 μm
  Acoustic layers 3b, 3d, and 3f serving as high-acoustic-impedance layers: W layers each having a thickness of about 0.34 μm The piezoelectric body 4 was made of LiTaO$_3$ with (about 90°, about 90°, φ) and had a thickness of about 1 μm.

First and second electrodes 5 and 6: Al electrodes

Each of the first and second electrodes 5 and 6 had a width of about 30 μm, a length of about 90 μm, and a thickness of about 10 nm. In the case where an Au film is used for each of the first and second electrodes 5 and 6, the thickness may be a density of Al (about 2.70 (g·cm$^{-3}$))/density of Au (about 19.32 ((g·cm$^{-3}$))×10 nm=about 1.40 nm.

Figure 5A:
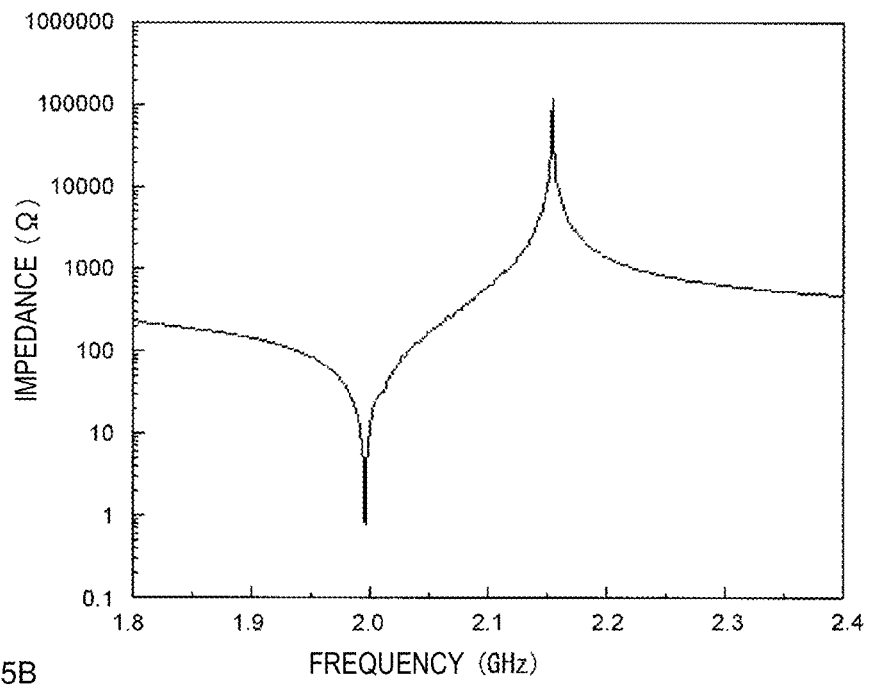
FIG. 5A is a graph illustrating impedance characteristics of a resonator that defines and functions as the acoustic wave device according to the first preferred embodiment of the present invention.

Frequency characteristics of the above-described acoustic wave device 1 are illustrated in FIG. 5A. In FIG. 5A, the horizontal axis denotes the frequency, and the vertical axis denotes the impedance of a resonator. FIG. 5A illustrates the characteristics when the Euler angles of LiTaO$_3$ are (about 90°, about 90°, about 36°). With the frequency characteristics, the impedance ratio of the resonator was about 111 dB, which is significantly large. Note that the impedance ratio of the resonator is the ratio of an impedance Za (Ω) of the resonator at an antiresonance frequency to an impedance Zr (Ω) of the resonator at a resonance frequency. In other words, it may be expressed by 20×log (Za/Zr) [dB].

Figure 6:
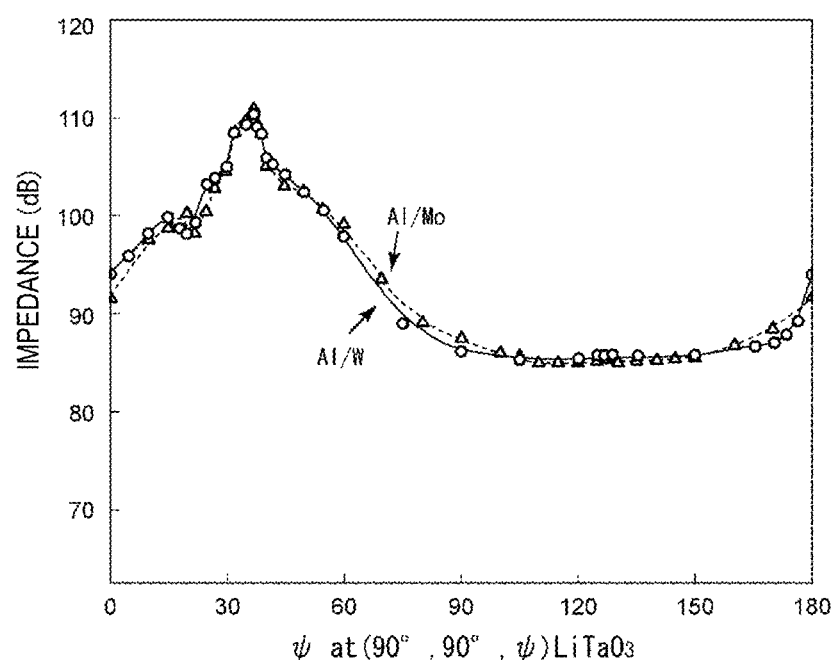
FIG. 6 is a graph illustrating a relationship between ψ of Euler angles (about 90°, about 90°, ψ) of a piezoelectric body including $LiTaO_3$ and the impedance ratio of the resonator.

The relationship with the impedance ratio of the resonator was determined by varying the propagation orientation of the above-mentioned piezoelectric body including LiTaO$_3$. The results are illustrated in FIG. 6. In FIG. 6, the horizontal axis denotes φ of the Euler angles (about 90°, about 90°, φ) of LiTaO$_3$, and the vertical axis denotes the impedance ratio of the resonator.

FIG. 6 illustrates not only the relationship between φ and the impedance ratio of the resonator in the case where W layers were used as the high-acoustic-impedance layers but also the relationship between φ and the impedance ratio of the resonator in the case where Mo layers were used as the high-acoustic-impedance layers instead of W layers.

As is clear from FIG. 6, it is understood that, in both cases where W layers are used as the high-acoustic-impedance layers and where Mo layers are used as the high-acoustic-impedance layers, when φ is within a range of about 5° or larger and about 65° or smaller, the impedance ratio of the resonator is high, which is about 95 dB or higher. Thus, the azimuth angle of LiTaO$_3$ is preferably set within, for example, a range of (about 85° to 95°, about 85° to 95°, about 5° to 65°) in the Euler angles. Note that the inventor of preferred embodiments of the present invention confirmed that an impedance ratio of approximately 95 dB or higher of the resonator can be obtained as long as the Euler angles φ and θ are each within a range of about 85° to 95°, even though the obtained impedance ratio of the resonator is lower by about 1 dB than that in the case where the Euler angles φ and θ are each about 90°.

More preferably, in FIG. 6, the azimuth angle is within, for example, a range of (about 85° to 95°, about 85° to 95°, about 24° to 50°) in the Euler angles. In this case, the impedance ratio of the resonator can be further improved to about 100 dB or higher. Further preferably, the azimuth angle is within, for example, a range of (about 85° to 95°, about 85° to 95°, about 32° to 39°) in the Euler angle representation. In this case, the impedance ratio of the resonator can be 105 dB or higher.

Note that, regarding the Euler angle representation of the azimuth angle of the piezoelectric body in the present invention, azimuth angles that are equivalent to Euler angles may be used. For example, (about 90°, about 90°, about 37°) is equivalent to (about 150°, about −90°, about 37°), (about −30°, about −90°, about 143°), (about 90°, about 270°, about 143°) and (about 90°, about 90°, about 217°).

Figure 5B:
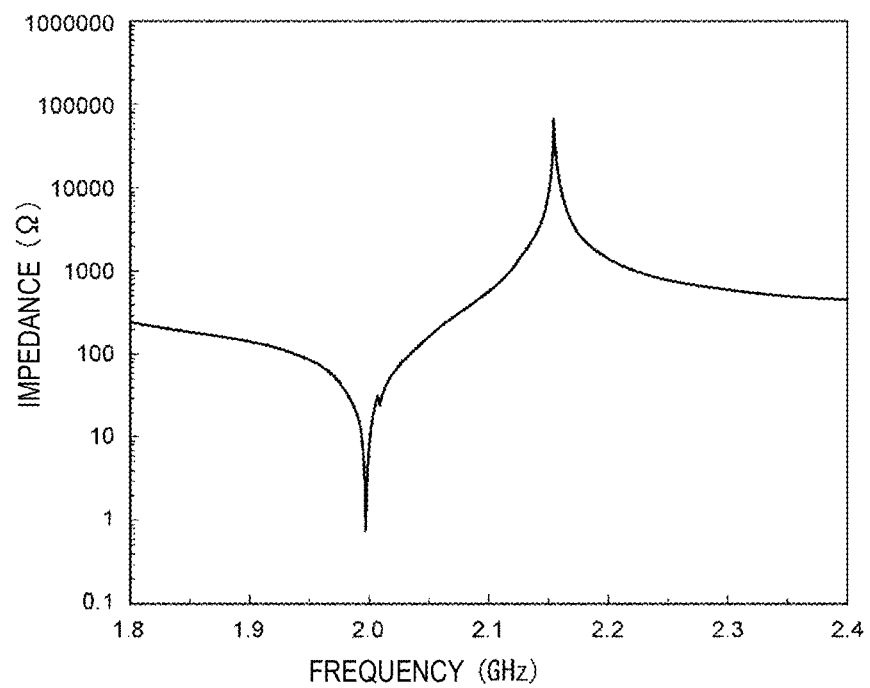
FIG. 5B is a graph illustrating impedance characteristics of a resonator of an acoustic wave device that has a configuration similar to that in the first preferred embodiment, except with Euler angles of (about 90°, about 90°, about 42°).
Figure 21:
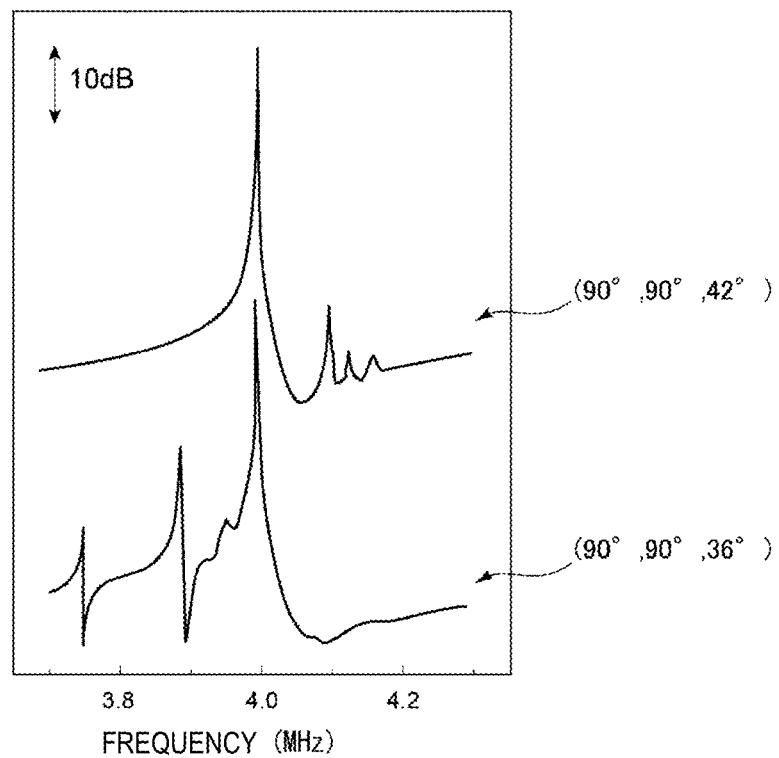
FIG. 21 is a graph illustrating the impedance characteristics of the resonator of the acoustic wave device described in IEEE Trans., vol. UFFC-34, No. 1, p. 39 (1987) as the related art. Impedance characteristics in the case of using $LiTaO_3$ having Euler angles (about 90°, about 90°, about 42°) are illustrated in the upper portion of FIG. 21, and impedance characteristics in the case of using $LiTaO_3$ having Euler angles (about 90°, about 90°, about 36°) are illustrated in the lower portion of FIG. 21.

Note that characteristics of strip-shaped resonators that include $LiTaO_3$ and $LiNbO_3$ substrates alone and that do not include either an acoustic-layer laminated body or a support substrate have been reported (IEEE trans., Vol. UFFC-34, No. 1, P. (1987)). The admittance characteristics of the acoustic wave device described in this report are illustrated in FIG. 21. The acoustic wave device in this report does not include an acoustic-layer laminated body, and at (about 90°, about 90°, about 36°) and (about 90°, about 90°, about 42°), a large spurious response is observed on the frequency side lower than the resonance frequency or on the frequency side higher than the resonance frequency. In preferred embodiments of the present invention, there is no significant difference between the case of (about 90°, about 90°, about 36°) illustrated in FIG. 5A and the case of (about 90°, about 90°, about 42°) illustrated in FIG. 5B. In addition, at (about 90°, about 90°, about 42°), a small spurious response is observed at about 2.02 GHz, whereas there is no spurious at (about 90°, about 90°, about 36°), and accordingly, (about 90°, about 90°, about 36°), for example, is more preferable. Since the acoustic wave device described in the report does not include an acoustic-layer laminated body, higher modes of width vibration and length vibration excluding thickness shear vibration results in a large spurious response and degradation of the Q characteristics of the resonator. In contrast, since the acoustic wave device 1 includes the acoustic-layer laminated body, the higher modes of width vibration and length vibration excluding thickness shear vibration are reduced or prevented by the acoustic-layer laminated body, and thus, degradation of the Q characteristics of the resonator is reduced or prevented. As described above, the resonator that is described in the above-mentioned report and that includes a $LiTaO_3$ substrate alone is completely different from the resonator according to a preferred embodiment of the present invention having the structure of an acoustic multilayer film.

Note that, in the structure described in the above report, it is necessary to reduce the thickness of the piezoelectric substrate to a few μm or less in order to achieve an operation at a higher frequency. However, since it does not include an acoustic-layer laminated body and is required to be structured so as to float in a cavity, with piezoelectric substrates such as $LiTaO_3$ and $LiNbO_3$, for example, its operation at a higher frequency cannot be achieved due to a problem of mechanical strength. In contrast, in the acoustic wave device 1, the mechanical strength can be improved by the acoustic-layer laminated body, and thus, the operation of the acoustic wave device 1 at a higher frequency can be achieved.

Although there is a report of thickness longitudinal vibration in a structure including an AlN thin film, an acoustic multilayer film, and a holding substrate, there is no report of thickness shear vibration. In addition, although an optimum film thickness of the acoustic multilayer film is, for example, about 0.5 T (T is the thickness of the piezoelectric substrate), in the case of the thickness-shear mode used in preferred embodiments of the present invention, the optimum film thickness is, for example about 0.48 T or less or about 0.46 T or less, which is smaller than about 0.5 T in the case of thickness longitudinal vibration. Thickness shear vibration used in preferred embodiments of the present invention is significantly different from thickness longitudinal vibration using an acoustic multilayer film reported so far.

Note that, although a Si substrate is used as a support substrate in the acoustic wave device 1, the material of the support substrate is not particularly limited. Various insulators, dielectrics, and semiconductors may be used, for example.

The materials of the low-acoustic-impedance layers and the high-acoustic-impedance layers included in the acoustic-layer laminated body 3 are not particularly limited as long as the relative acoustic impedance relationship is satisfied. The following materials can be examples of the materials of the acoustic layers. In Table 1, the materials that can be used to form the acoustic layers are shown in numerical order of a longitudinal-wave acoustic impedance Zl ($Ns/m^3$). In Table 2, the materials that can be used are shown in numerical order of a transversal-wave acoustic impedance Zs ($Ns/m^3$).

TABLE 1

| MATERIAL | DENSITY (kg · $m^3$) | c33 | Vl (m/s) | Zl ($Ns/m^3$) | c44 | V (m/s) | Zs ($Ns/m^3$) |
|---|---|---|---|---|---|---|---|
| Mg ALLOY | 1800 | 7.222E+10 | 6334 | 1.14E+07 | 1.667E+10 | 3043 | 5.48E+06 |
| $SiO_2$ | 2210 | 7.850E+10 | 5960 | 1.32E+07 | 3.120E+10 | 3757 | 8.30E+06 |
| Al | 2699 | 1.113E+11 | 6422 | 1.73E+07 | 2.610E+10 | 3110 | 8.39E+06 |
| Ti | 4510 | 1.661E+11 | 6069 | 2.74E+07 | 4.380E+10 | 3116 | 1.41E+07 |
| ZnO | 5665 | 2.096E+11 | 6083 | 3.45E+07 | 4.230E+10 | 2733 | 1.55E+07 |
| $Si_xN_y$ | 3200 | 3.710E+11 | 10767 | 3.45E+07 | 1.130E+11 | 5942 | 1.90E+07 |
| AlN | 3260 | 3.950E+11 | 11008 | 3.59E+07 | 1.180E+11 | 6016 | 1.96E+07 |
| SiC | 3200 | 4.580E+11 | 11963 | 3.83E+07 | 1.650E+11 | 7181 | 2.30E+07 |
| $Al_2O_3$ | 3800 | 4.170E+11 | 10476 | 3.98E+07 | 1.460E+11 | 6198 | 2.36E+07 |
| Ag | 10500 | 1.527E+11 | 3814 | 4.00E+07 | 3.290E+10 | 1770 | 1.86E+07 |
| Cu | 8930 | 2.106E+11 | 4856 | 4.34E+07 | 5.140E+10 | 2399 | 2.14E+07 |
| $TiO_2$ | 4249 | 4.700E+11 | 10517 | 4.47E+07 | 1.232E+11 | 5385 | 2.29E+07 |

TABLE 1-continued

| MATERIAL | DENSITY (kg · m³) | c33 | VI (m/s) | ZI (Ns/m³) | c44 | V (m/s) | Zs (Ns/m³) |
|---|---|---|---|---|---|---|---|
| Ni | 8845 | 3.115E+11 | 5934 | 5.25E+07 | 9.290E+10 | 3241 | 2.87E+07 |
| Au | 19300 | 2.202E+11 | 3378 | 6.52E+07 | 2.990E+10 | 1245 | 2.40E+07 |
| Ta | 16678 | 2.668E+11 | 4000 | 6.67E+07 | 8.249E+10 | 2224 | 3.71E+07 |
| Mo | 10219 | 4.696E+11 | 6779 | 6.93E+07 | 1.068E+11 | 3233 | 3.30E+07 |
| Pt | 21400 | 3.356E+11 | 3960 | 8.47E+07 | 5.968E+10 | 1670 | 3.57E+07 |
| W | 19265 | 5.214E+11 | 5202 | 1.00E+08 | 1.604E+11 | 2885 | 5.56E+07 |

TABLE 2

| MATERIAL | DENSITY (kg · m³) | c33 | VI (m/s) | ZI (Ns/m³) | c44 | V (m/s) | Zs (Ns/m³) |
|---|---|---|---|---|---|---|---|
| Mg ALLOY | 1800 | 7.222E+10 | 6334 | 1.14E+07 | 1.667E+10 | 3043 | 5.48E+06 |
| SiO$_2$ | 2210 | 7.850E+10 | 5960 | 1.32E+07 | 3.120E+10 | 3757 | 8.30E+06 |
| Al | 2699 | 1.113E+11 | 6422 | 1.73E+07 | 2.610E+10 | 3110 | 8.39E+06 |
| Ti | 4510 | 1.661E+11 | 6069 | 2.74E+07 | 4.380E+10 | 3116 | 1.41E+07 |
| ZnO | 5665 | 2.096E+11 | 6083 | 3.45E+07 | 4.230E+10 | 2733 | 1.55E+07 |
| Ag | 10500 | 1.527E+11 | 3814 | 4.00E+07 | 3.290E+10 | 1770 | 1.86E+07 |
| Si$_x$N$_y$ | 3200 | 3.710E+11 | 10767 | 3.45E+07 | 1.130E+11 | 5942 | 1.90E+07 |
| AlN | 3260 | 3.950E+11 | 11008 | 3.59E+07 | 1.180E+11 | 6016 | 1.96E+07 |
| Cu | 8930 | 2.106E+11 | 4856 | 4.34E+07 | 5.140E+10 | 2399 | 2.14E+07 |
| TiO$_2$ | 4249 | 4.700E+11 | 10517 | 4.47E+07 | 1.232E+11 | 5385 | 2.29E+07 |
| SiC | 3200 | 4.580E+11 | 11963 | 3.83E+07 | 1.650E+11 | 7181 | 2.30E+07 |
| Al$_2$O$_3$ | 3800 | 4.170E+11 | 10476 | 3.98E+07 | 1.460E+11 | 6198 | 2.36E+07 |
| Au | 19300 | 2.202E+11 | 3378 | 6.52E+07 | 2.990E+10 | 1245 | 2.40E+07 |
| Ni | 8845 | 3.115E+11 | 5934 | 5.25E+07 | 9.290E+10 | 3241 | 2.87E+07 |
| Mo | 10219 | 4.696E+11 | 6779 | 6.93E+07 | 1.068E+11 | 3233 | 3.30E+07 |
| Pt | 21400 | 3.356E+11 | 3960 | 8.47E+07 | 5.968E+10 | 1670 | 3.57E+07 |
| Ta | 16678 | 2.668E+11 | 4000 | 6.67E+07 | 8.249E+10 | 2224 | 3.71E+07 |
| W | 19265 | 5.214E+11 | 5202 | 1.00E+08 | 1.604E+11 | 2885 | 5.56E+07 |

Note that ZnO is included in both Table 1 and Table 2, and when ZnO is used for the low-acoustic-impedance layers, high-acoustic-impedance layers that yield an impedance difference may be used. Conversely, when ZnO is used for the high-acoustic-impedance layers, low-acoustic-impedance layers made of a material having an acoustic impedance lower than that of ZnO may be used. Note that the material of the low-acoustic-impedance layers and the material of the high-acoustic-impedance layers are not limited to those shown in Table 1 and Table 2, and, for example, alloys including these metals, carbides, oxides, nitrides and so forth can be widely used.

For the low-acoustic-impedance layers each having a low acoustic impedance, for example, a Mg alloy, SiO$_2$, Al, Ti (in the case of transversal wave), ZnO, and so forth may preferably be used. For the high-acoustic-impedance layers, for example, ZnO, Ag, SiN, AlN, Cu, TiO$_2$, SiC, Al$_2$O$_3$, Au, Ni, Mo, Hf, Pt, Ta, W, and so forth may preferably be used. Alloys including metals such as, for example, Au, Ni, Mo, Hf, Pt, Ta and W, oxides, nitrides, carbides, and so forth may also preferably be used.

Second Preferred Embodiment

In a second preferred embodiment of the present invention, LiNbO$_3$ is used as the piezoelectric body 4 illustrated in FIG. 1, whereas LiTaO$_3$ is used in the first preferred embodiment. The remainder of the configuration of the acoustic wave device of the second preferred embodiment is the same as or similar to that of the acoustic wave device of the first preferred embodiment. Accordingly, the description of the structure of the acoustic wave device of the second preferred embodiment will be omitted by incorporating the description of the structure of the acoustic wave device 1 of the first preferred embodiment and the descriptions of the other portions.

Figure 7:
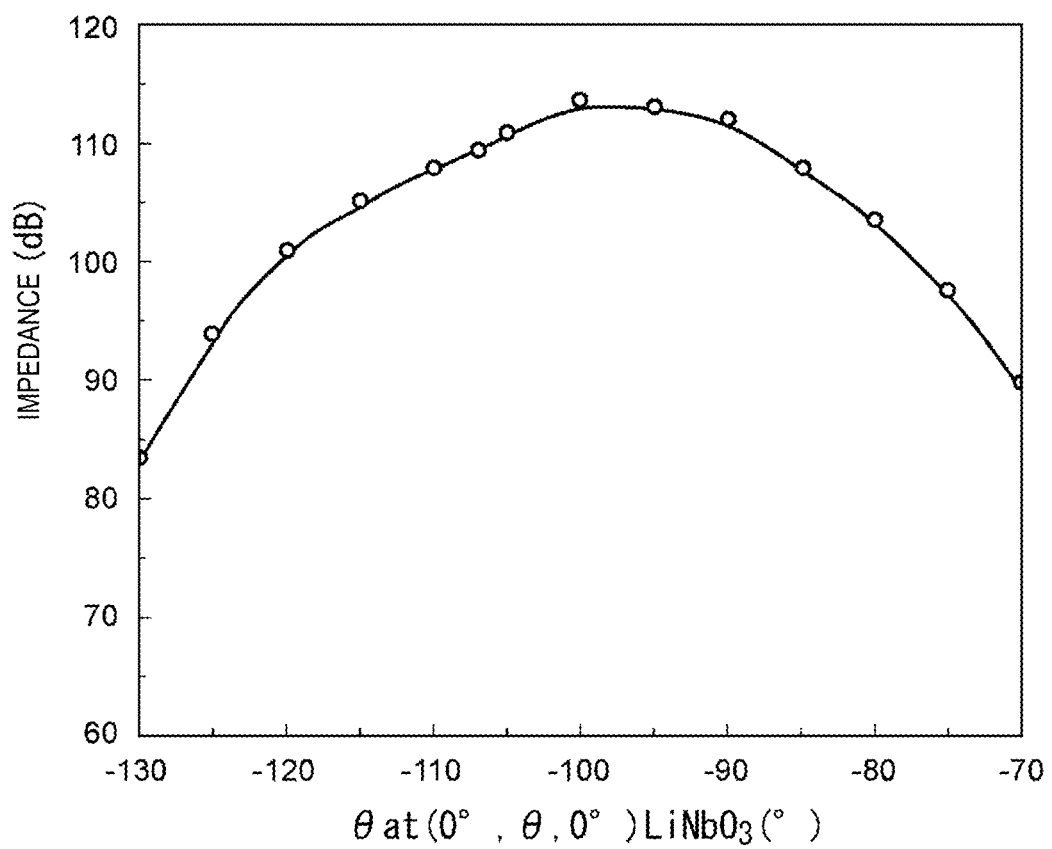
FIG. 7 is a graph illustrating a relationship between θ of Euler angles (about 0°, θ, about 0°) of a piezoelectric body including $LiNbO_3$ and the impedance ratio of the resonator.
Figure 8:
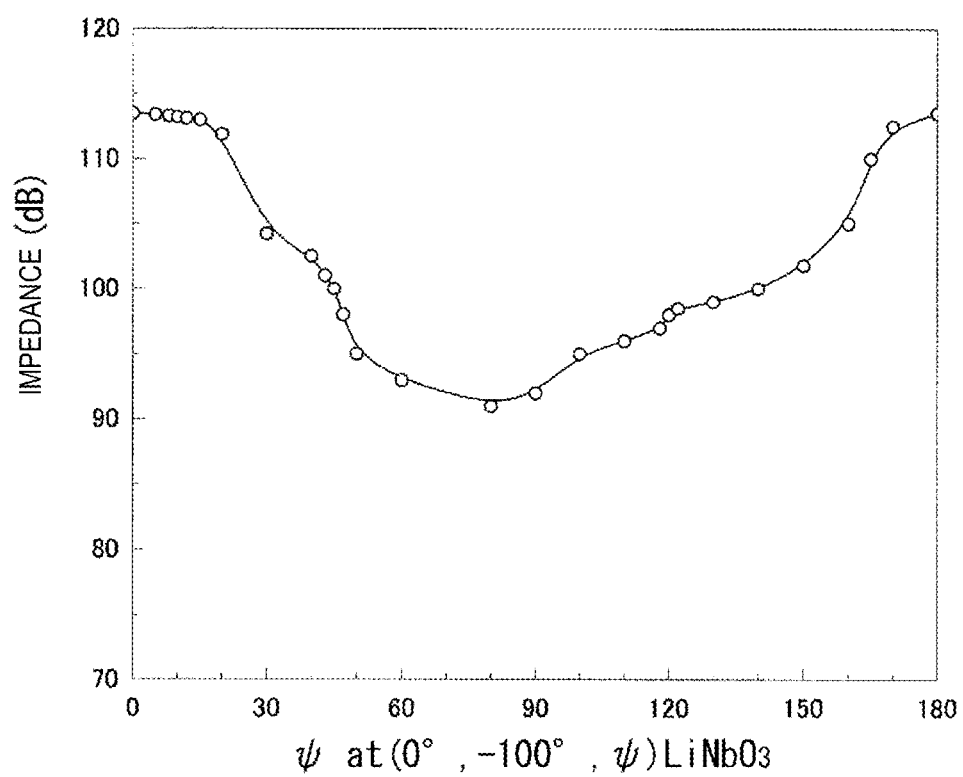
FIG. 8 is a graph illustrating a relationship between ψ of Euler angles (about 0°, about −100°, ψ) of a piezoelectric body including $LiNbO_3$ and the impedance ratio of the resonator.

In the acoustic wave device of the second preferred embodiment, as LiNbO$_3$, θ of Euler angles (about 0°, θ, about 0°) and φ of Euler angles (about 0°, about −100°, φ) were varied so as to determine the impedance ratio of the resonator was determined. The impedance ratio of the resonator in the case of varying θ of the Euler angles (about 0°, θ, about 0°) is illustrated in FIG. 7, and the impedance ratio of the resonator in the case of varying φ of the Euler angles (about 0°, about −100°, φ) is illustrated in FIG. 8. In FIG. 7, the horizontal axis denotes θ of the Euler angles (about 0°, θ, about 0°), and the vertical axis denotes the impedance ratio of the resonator. In FIG. 8, the horizontal axis denotes φ of the Euler angles (about 0°, about −100°, φ), and the vertical axis denotes the impedance ratio of the resonator.

As is clear from FIG. 7, it is understood that, when θ is within a range of, for example, about −121° to −77°, the impedance ratio of the resonator is high, which is about 100 dB or higher. Preferably, when θ is within a range of, for example, about −106° to −87°, the impedance ratio of the resonator can be improved to about 110 dB or higher. More preferably, when θ is within a range of, for example, −104° to −90°, the impedance ratio of the resonator can be further improved to about 112 dB or higher. Note that θ may be an orientation equivalent to these Euler angles.

As is clear from FIG. 8, it is understood that, when φ is within a range of, for example, about 0° to 45° or a range of, for example, about 140° to 180°, the impedance ratio of the resonator is high, which is about 100 dB or higher. Preferably, when φ is within a range of, for example, about 0° to 26° or a range of, for example, about 165° to 180°, the impedance ratio of the resonator can be improved to about 110 dB or higher. More preferably, when φ is within a range of, for example, about 0° to 20° or a range of, for example, about 167° to 180°, the impedance ratio of the resonator can be further improved to about 112 dB or higher.

Note that, when the Euler angle φ is within a range of, for example, about −10° to 10°, similar results with an impedance ratio lower by about 1 dB than that in the case where the Euler angle φ is about 0° may be obtained.

Thus, the azimuth angle of the piezoelectric body including $LiNbO_3$ may be, for example, (about −10° to 10°, about −121° to −77°, about 0° to 45°) or (about −10° to 10°, about −121° to −77°, about 140° to 180°) in the Euler angles.

Preferably, the azimuth angle of the piezoelectric body may be, for example, (about −10° to 10°, about −106° to −87°, about 0° to 26°) or (about −10° to 10°, about −106° to −87°, about 165° to) 180° in the Euler angles. In this case, the impedance ratio of the resonator can be improved to about 110 dB or higher.

More preferably, the azimuth angle of the piezoelectric body may be, for example, (about −10° to 10°, about −104° to −90°, about 0° to 20°) or (about −10° to 10°, about −104° to −90°, about 167° to 180°) in the Euler angles. In this case, the impedance ratio of the resonator can be further improved to about 112 dB or higher.

In the first and second preferred embodiments, the acoustic layers 3a, 3c, and 3e are made of the same material. In addition, the acoustic layers 3b, 3d, and 3f are made of the same material. The low-acoustic-impedance layers may be made of different materials, and the high-acoustic-impedance layers may also be made of different materials.

Figure 9:
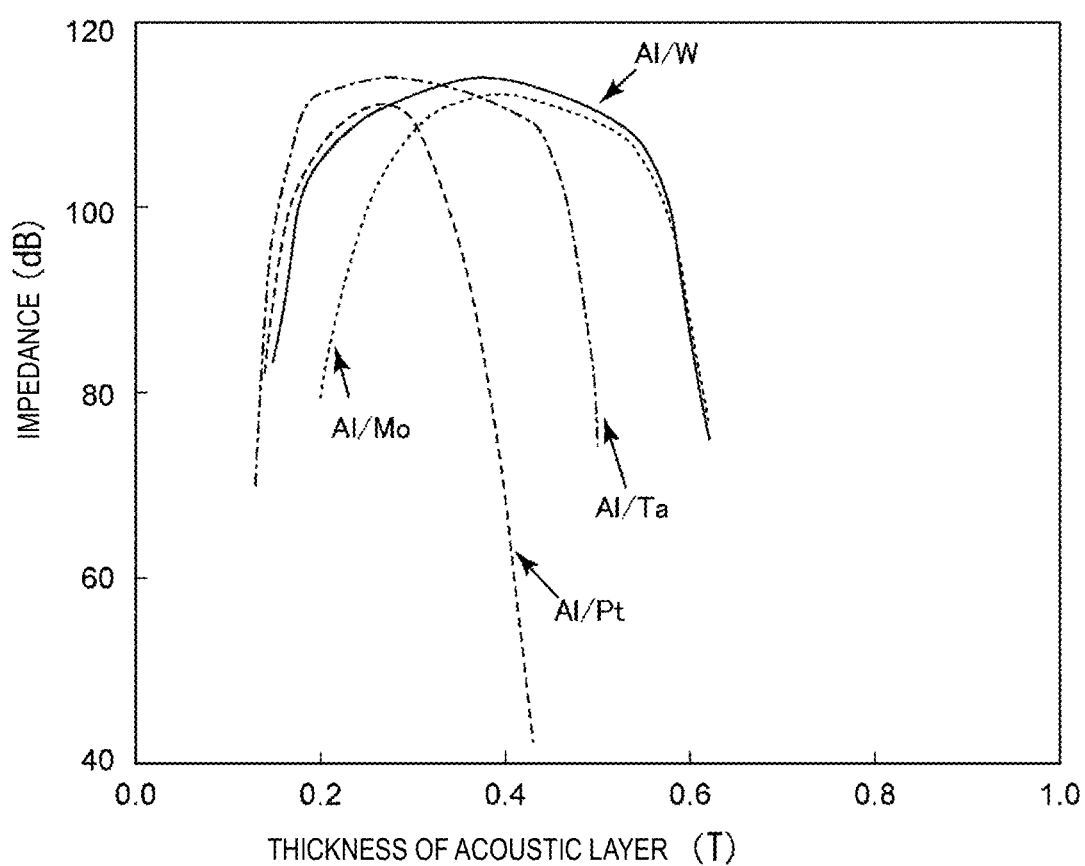
FIG. 9 is a graph illustrating a relationship between a thickness (T) of an acoustic layer and the impedance ratio of the resonator when each low-acoustic-impedance layer is made of Al, and each high-acoustic-impedance layer is made of W, Ta, Pt, or Mo.

When the acoustic layers 3a to 3f are referred to as the first acoustic layer, the second acoustic layer, and so on, starting from the acoustic layer closest to the piezoelectric body 4, the odd-numbered acoustic layers 3a, 3c, and 3e are the low-acoustic-impedance layers, and the even-numbered acoustic layers 3b, 3d, and 3f are the high-acoustic-impedance layers. FIG. 9 is a graph illustrating the relationship between the thickness of each acoustic layer and the impedance ratio of the resonator when the low-acoustic-impedance layers are Al layers, and the high-acoustic-impedance layers are made of W, Mo, Ta, or Pt, for example. As is clear from FIG. 9, it is understood that even if the type of the high-acoustic-impedance layers is changed, a sufficiently high impedance ratio of the resonator can be achieved by selecting the thickness of each acoustic layer. It is preferable that the high-acoustic-impedance layers is made of, for example, W because, in this case, a high impedance ratio of the resonator can be obtained in a wider range of the layer thickness.

Figure 10:
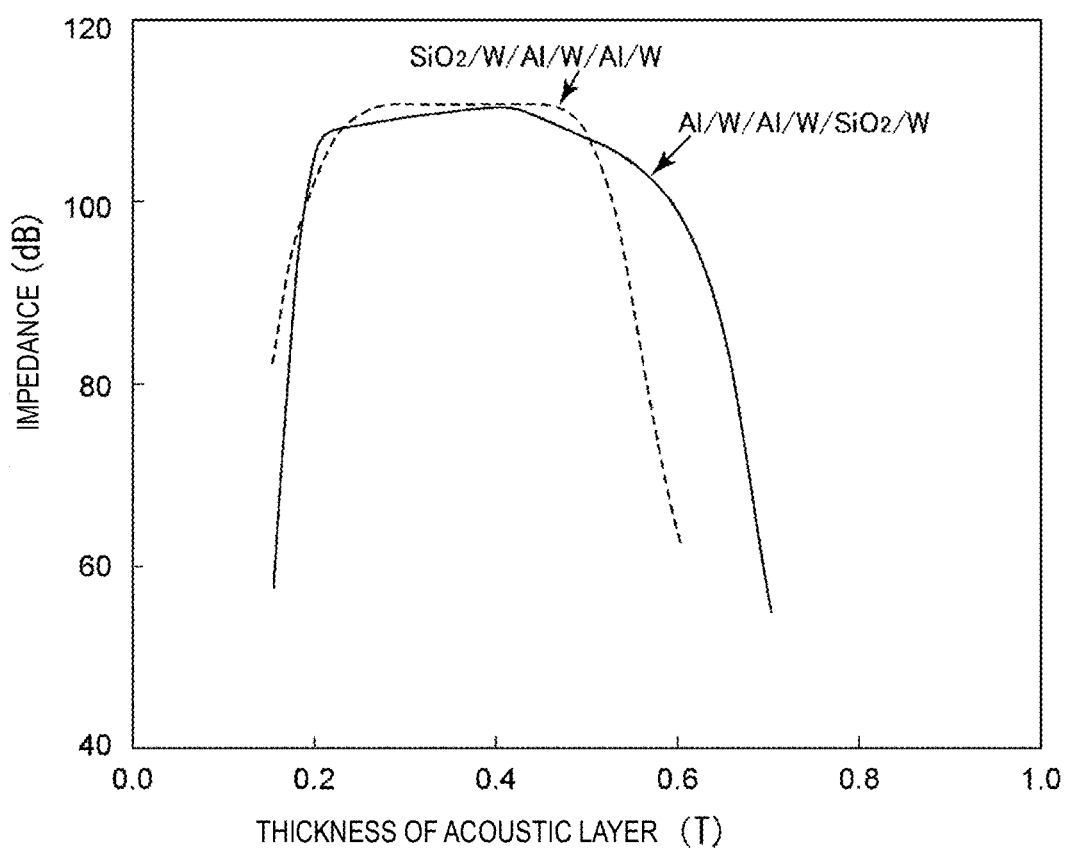
FIG. 10 is a graph illustrating a relationship between the thickness (T) of one of the acoustic layers and the impedance ratio of the resonator when each of the high-acoustic-impedance layers is made of W, and the material of the first acoustic layer, which is one of the low-acoustic-impedance layers, is $SiO_2$ and a relationship between the thickness (T) of one of the acoustic layers and the impedance ratio of the resonator when each of the high-acoustic-impedance layers is made of W, and the material of the first acoustic layer, which is one of the low-acoustic-impedance layers, is Al.

FIG. 10 is a graph illustrating the relationship between the thickness of each acoustic layer and the impedance ratio of the resonator when the acoustic layer 3a or 3e is, for example, a $SiO_2$ layer, and the other acoustic layers are, for example, a combination of Al layers and W layers, that is, when these acoustic layers are arranged in the order of $SiO_2$/W/Al/W/Al/W or in the order of Al/W/Al/W/$SiO_2$/W. Note that all of the acoustic layers have the same or substantially the same thickness. The horizontal axis denotes the thickness of one of the acoustic layers. As is clear from FIG. 10, it is understood that even if the material of the first or the fifth acoustic layer, which is the acoustic layer 3a or 3e, is changed from Al to $SiO_2$, for example, a high impedance ratio of the resonator can be obtained.

Thus, as is clear from FIG. 9 and FIG. 10, the acoustic layers 3a, 3c, and 3e do not need to be made of the same material, and similarly, the acoustic layers 3b, 3d, and 3f do not need to be made of the same material.

In the above-described acoustic wave device 1 of the first preferred embodiment, the impedance ratio of the resonator was determined by varying the number of acoustic layers included in the acoustic-layer laminated body 3. The results are illustrated in FIG. 11.

Figure 11:
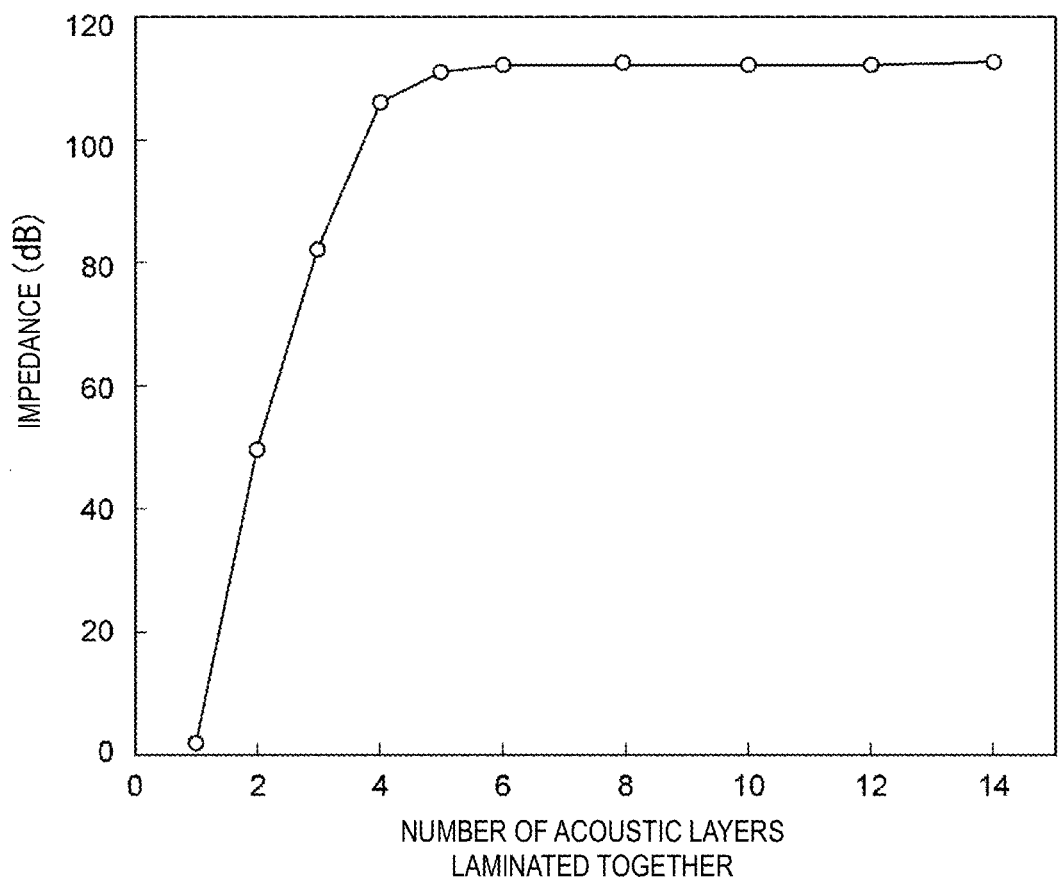
FIG. 11 is a graph illustrating a relationship between the number of acoustic layers laminated together and the impedance ratio of the resonator.

As illustrated in FIG. 11, as the number of acoustic layers included in the acoustic-layer laminated body 3 increases, the impedance ratio of the resonator becomes higher. In particular, when the number of acoustic layers is four or more, the impedance ratio of the resonator can be improved to about 105 dB or higher. Thus, it is preferable that the number of acoustic layers included in the acoustic-layer laminated body 3 is, for example, four or more. More preferably, the number of acoustic layers included in the acoustic-layer laminated body 3 may be, for example, five or more. In this case, the impedance ratio of the resonator can be further improved to about 110 dB or higher.

Next, in the acoustic wave device 1 of the first preferred embodiment, it is preferable that the acoustic impedance ratio (Zl-low/Zl-high) of the longitudinal-wave acoustic impedance (Zl-low) of each of the low-acoustic-impedance layers, which are the odd-numbered acoustic layers, to the longitudinal-wave acoustic impedance (Zl-high) of each of the high-acoustic-impedance layers, which are the even-numbered acoustic layers, is, for example, about 0.06 or more and about 0.51 or less. Here, the longitudinal-wave acoustic impedance is expressed by $(c33 \times \rho)^{1/2}$ or $(c11 \times \rho)^{1/2}$. Here, the thickness of the piezoelectric body is denoted by T, and c33 or c11 is the elastic constant stiffness of an acoustic layer. In addition, ρ is the density of the acoustic layer. In addition, the velocity of a longitudinal wave in the acoustic layer is expressed by $(C44/\rho)^{1/2}$.

Figure 12:
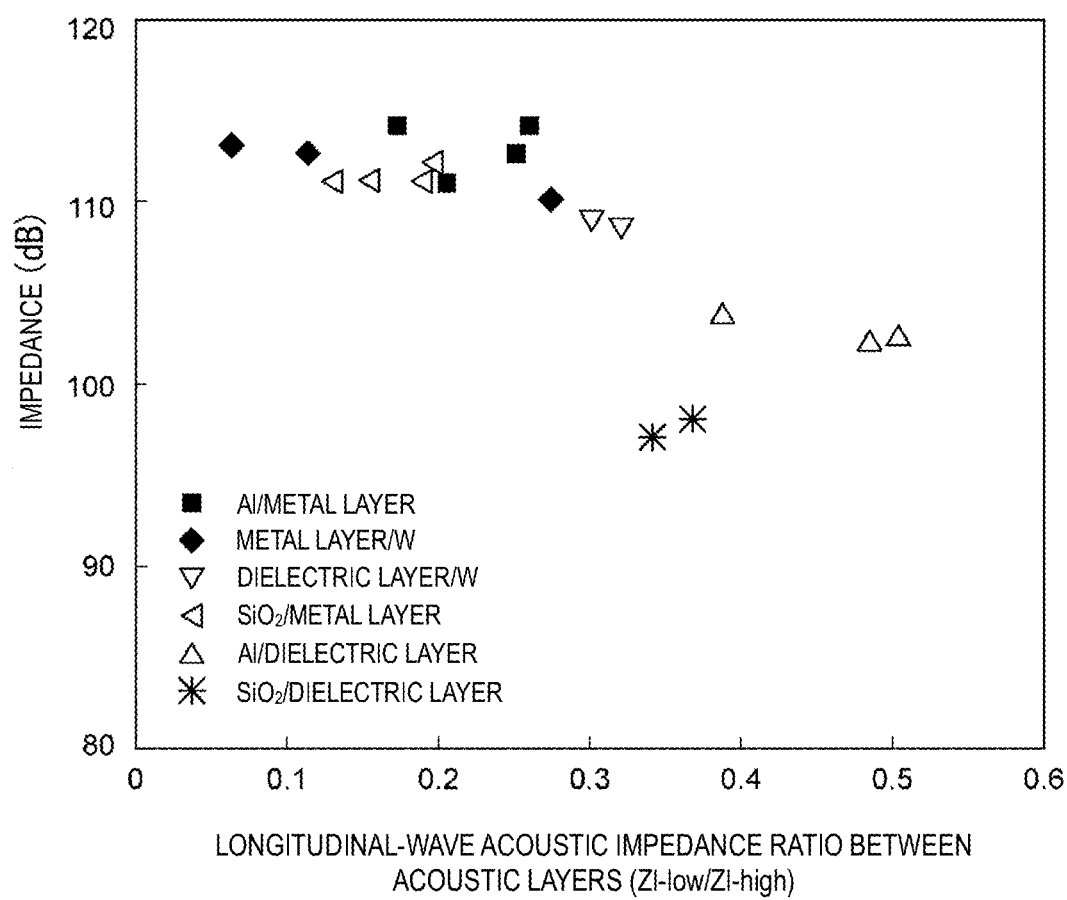
FIG. 12 is a graph illustrating a relationship between a longitudinal-wave acoustic impedance ratio (Zl-low/Zl-high) in the acoustic layers and the impedance ratio of the resonator.

FIG. 12 is a graph illustrating the relationship between the longitudinal-wave acoustic impedance ratio (Zl-low/Zl-high) and the impedance ratio of the resonator. FIG. 12 illustrates the relationships between the acoustic impedance ratios of various materials and the impedance ratio of the resonator.

As is clear from FIG. 12, it is understood that, when the longitudinal-wave acoustic impedance ratio is within a range of about 0.06 or more and about 0.51 or less, a high impedance ratio of about 100 dB or higher of the resonator can be obtained.

More preferably, the acoustic impedance ratio (Zl-low/Zl-high) may be, for example, about 0.06 or more and about 0.32 or less, and in this case, the impedance ratio of the resonator can be about 108 dB or higher. In the case where the longitudinal-wave acoustic impedances of some of the high-acoustic-impedance layers differ from each other, the average value of the longitudinal-wave acoustic impedances of all the high-acoustic-impedance layers is set as Zl-high, and in the case where the longitudinal-wave acoustic impedances of some of the low-acoustic-impedance layers differ from each other, the average value of the longitudinal-wave acoustic impedances of all the low-acoustic-impedance layers is set as Zl-low.

Figure 13:
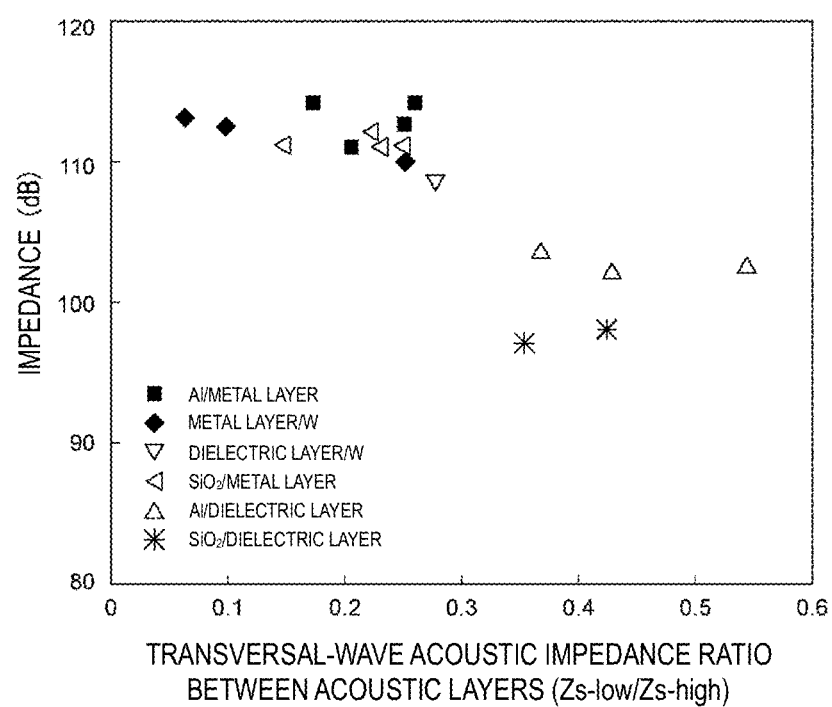
FIG. 13 is a graph illustrating a relationship between a transversal-wave acoustic impedance ratio between the acoustic layers (Zs-low/Zs-high) and the impedance ratio of the resonator.

FIG. 13 is a graph illustrating the relationship between the acoustic impedance ratio (Zs-low/Zs-high) of the transversal-wave acoustic impedance (Zs-low) of each of the low-acoustic-impedance layers, which are the odd-numbered acoustic layers, to the transversal-wave acoustic impedance (Zs-high) of each of the high-acoustic-impedance layers, which are the even-numbered acoustic layers and the impedance ratio of the resonator. Here, the transversal-wave acoustic impedance is expressed by $(c44 \times \rho)^{1/2}$. In the expression, c44 is the elastic constant stiffness of the acoustic layer, and ρ is the density of the acoustic layer. The thickness of the piezoelectric body is denoted by T. Note that the velocity of a transversal wave in the acoustic layer is expressed by $(C44/\rho)^{1/2}$.

As is clear from 13, it is understood that, when the transversal-wave acoustic impedance ratio is within a range of about 0.06 or more and about 0.54 or less, an impedance ratio of about 100 dB or higher of the resonator can be obtained, and more preferably, when the transversal-wave acoustic impedance ratio is within a range of about 0.06 or more and about 0.28 or less, an impedance ratio of about 108 dB or higher of the resonator can be obtained. In the case where the transversal-wave acoustic impedances of some of the high-acoustic-impedance layers differ from each other, the average value of the transversal-wave acoustic impedances of all the high-acoustic-impedance layers is set as Zs-high, and in the case where the transversal-wave acoustic impedances of some of the low-acoustic-impedance layers differ from each other, the average value of the transversal-wave acoustic impedances of all the low-acoustic-impedance layers is set as Zs-low.

Although the thickness of each of the acoustic layers 3a to 3f included in the acoustic-layer laminated body 3 is not particularly limited, for example, it is preferable to satisfy one of the following conditions: the thickness of each of the odd-numbered acoustic layers 3a, 3c, and 3e is about 0.14 T or more and about 0.60 T or less and the thickness of each of the even-numbered acoustic layers 3b, 3d, and 3f is about 0.08 T or more and about 0.56 T or less. In this case, the impedance ratio of the resonator can be effectively improved. This matter will now be described with reference to FIG. 14 and FIG. 15. Note that the letter "T" denotes the thickness of the piezoelectric body.

Thickness vibration devices of the related art that use AlN films and acoustic multilayer films are evaluated by their acoustic impedances for longitudinal waves. In contrast, the acoustic wave device according to a preferred embodiment of the present invention that uses the thickness-shear mode can be evaluated by its acoustic impedance for a transversal wave. This is a significant difference from devices of the related art.

In the acoustic wave device according to a preferred embodiment of the present invention, although the impedance ratio of the resonator is correlated with the longitudinal-wave acoustic impedance, the impedance ratio of the resonator is more strongly correlated with the transversal-wave acoustic impedance.

Figure 14:
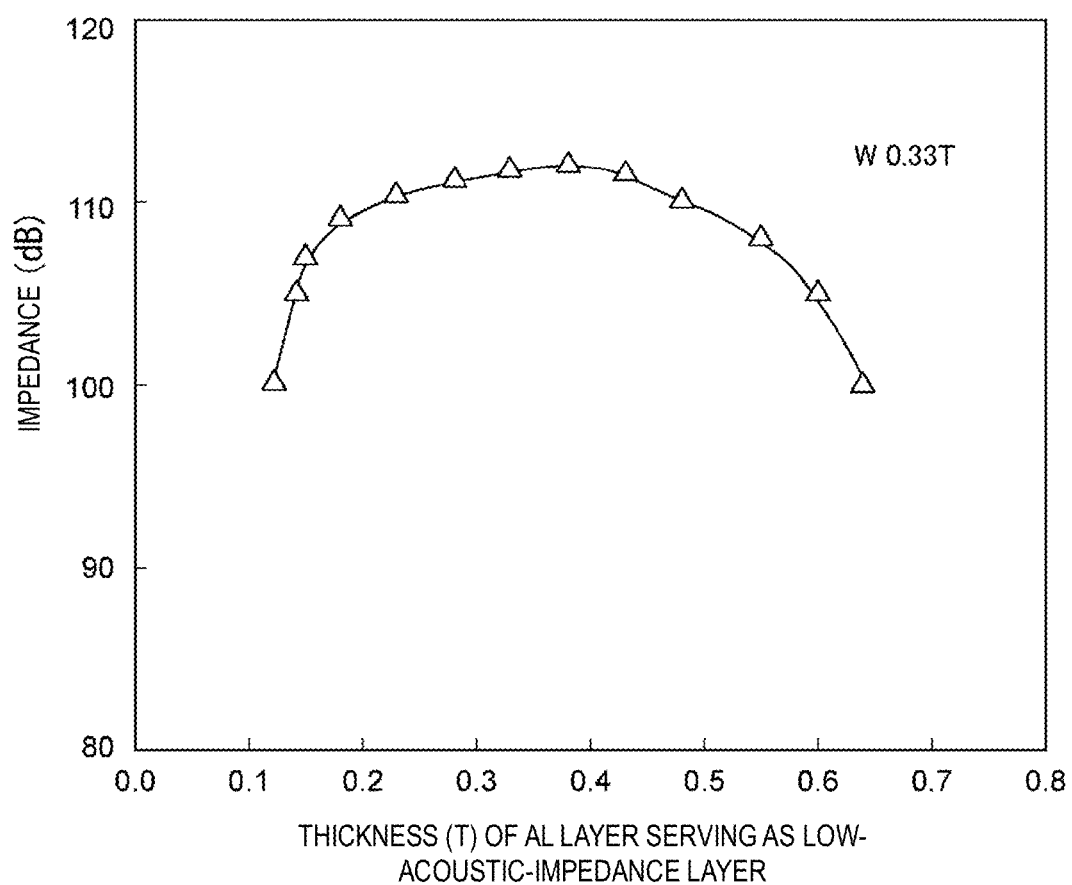
FIG. 14 is a graph illustrating a relationship between the thickness (T) of each of the low-acoustic-impedance layers made of Al and the impedance ratio of the resonator.

FIG. 14 illustrates the relationship between the thickness (T) of each of the low-acoustic-impedance layers made of Al layers and the impedance ratio of the resonator. As the high-acoustic-impedance layers, W layers each having a thickness of about 0.33 T were used. As is clear from FIG. 14, it is understood that, when the thickness of each of the Al layers, which are the low-acoustic-impedance layers, is about 0.14 T or more and about 0.60 T or less, the impedance ratio of the resonator can be about 100 dB or higher. More preferably, when the thickness of each of the Al layers, which are the low-acoustic-impedance layers, is about 0.23 T or more and about 0.48 T or less, the impedance ratio of the resonator can be improved to about 110 dB or higher. The low-acoustic-impedance layers and the high-acoustic-impedance layers do not need to have the same or substantially the same thickness as long as the above-mentioned condition is satisfied.

Figure 15:
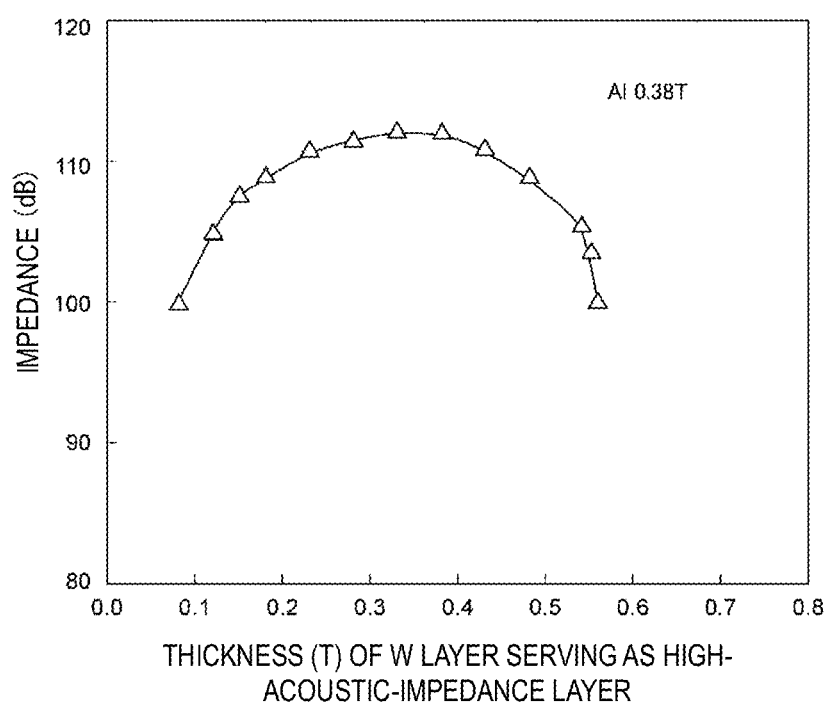
FIG. 15 is a graph illustrating a relationship between the thickness (T) of each of the high-acoustic-impedance layers made of W and the impedance ratio of the resonator.

FIG. 15 is a graph illustrating the relationship between the thickness (T) of each of the W layers, which serve as the high-acoustic-impedance layers, and the impedance ratio of the resonator. As the low-acoustic-impedance layers, Al layers each having a thickness of about 0.38 T were used. As is clear from FIG. 15, it is understood that, when the thickness of each of the high-acoustic-impedance layers, which are the even-numbered acoustic layers 3b, 3d, and 3f, is about 0.08 T or more and about 0.56 T or less, the impedance ratio of the resonator is about 100 dB or higher. More preferably, it is understood that, when the thickness of each of the high-acoustic-impedance layers is about 0.19 T or more and about 0.46 T or less, the impedance ratio of the resonator can be about 110 dB or higher. Note that the thicknesses of the even-numbered acoustic layers 3b, 3d, and 3f may differ from one another.

Therefore, in preferred embodiments of the present invention, for example, it is preferable to satisfy at least one of the following conditions: the thickness of each of the odd-numbered acoustic layers 3a, 3c, and 3e, which are the low-acoustic-impedance layers, is about 0.14 T or more and about 0.60 T or less and the thickness of each of the even-numbered acoustic layers 3b, 3d, and 3f, which are the high-acoustic-impedance layers, is about 0.08 T or more and about 0.56 T or less. It is more preferable, for example, to satisfy at least one of the following conditions: the thickness of each of the odd-numbered acoustic layers is about 0.23 T or more and about 0.48 T or less and the thickness of each of the even-numbered acoustic layers is about 0.19 T or more and about 0.46 T or less.

Figure 16:
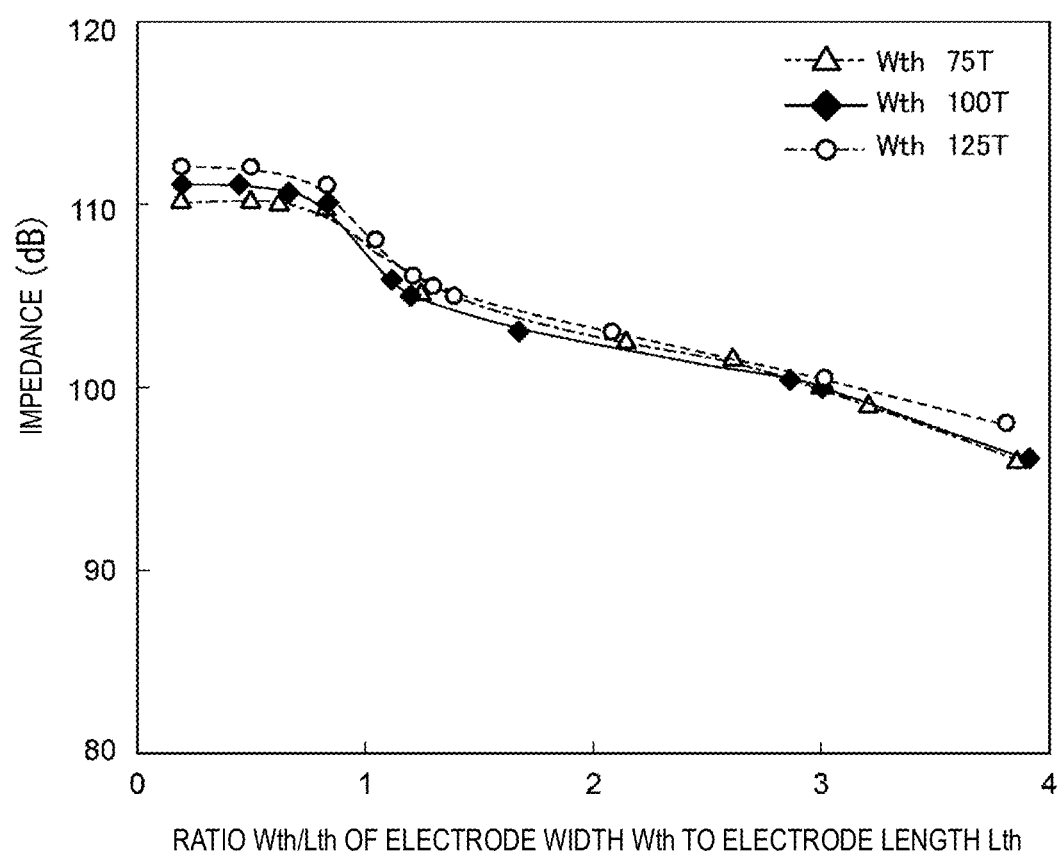
FIG. 16 is a graph illustrating a relationship between a ratio Wth/Lth of an electrode width Wth to an electrode length Lth and the impedance ratio of the resonator.

FIG. 16 is a graph illustrating the relationship between the ratio Wth/Lth of a width Wth of each of the first and second electrodes 5 and 6 to a length Lth of each of the first and second electrodes 5 and 6 in the acoustic wave device of the second preferred embodiment and the impedance ratio of the resonator. An electrode length is a dimension in a plane parallel or substantially parallel to a groove that is provided in the vicinity of an electrode, and an electrode width is a dimension in a plane perpendicular or substantially perpendicular to the groove. Note that, in the case where each electrode has an irregular shape such as a trapezoidal shape, an elliptical shape, or a polygonal shape, for example, the average value of the electrode lengths parallel or substantially parallel to the groove in the vicinity of the electrode is set as the electrode length, and the average value of the electrode widths perpendicular or substantially perpendicular to the groove in the vicinity of the electrode is set as the electrode width.

Here, the results in the cases where the width W of each electrode is about 75 T, about 100 T, and about 125 T will be described. As is clear from FIG. 16, it is preferable that the ratio Wth/Lth of the width Wth of each electrode to the length Lth of each electrode is about 3 or less. In this case, the impedance ratio of the resonator in resonance characteristics can be about 100 dB or higher. More preferably, the ratio Wth/Lth may be about 1.2 or less, and in this case, the impedance ratio of the resonator can be about 105 dB or higher. Further preferably, the ratio Wth/Lth may be about 0.2 or more and about 0.8 or less. In this case, the impedance ratio of the resonator can be about 110 dB or higher.

Figure 17A:
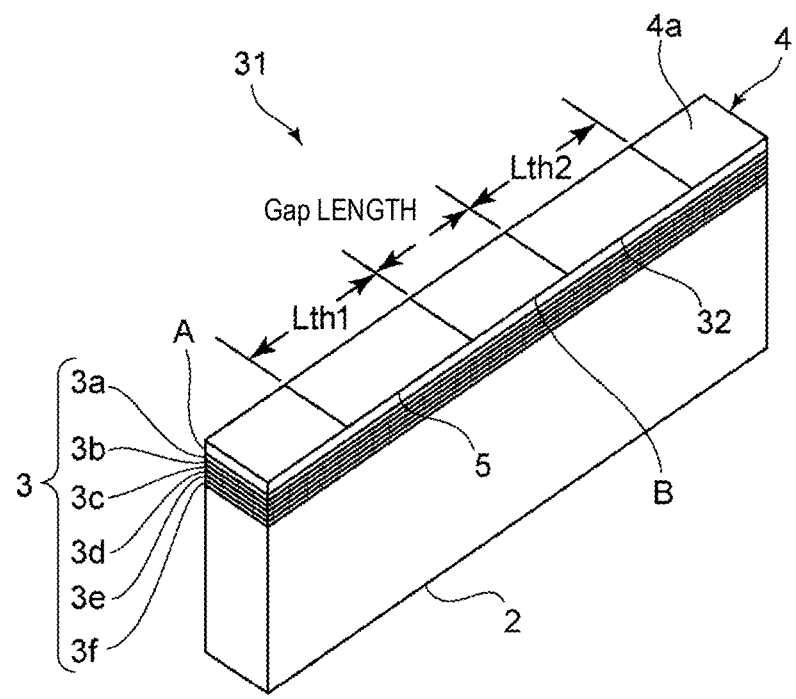
FIG. 17A is a perspective view of an acoustic wave device according to a third preferred embodiment of the present invention.
Figure 17B:
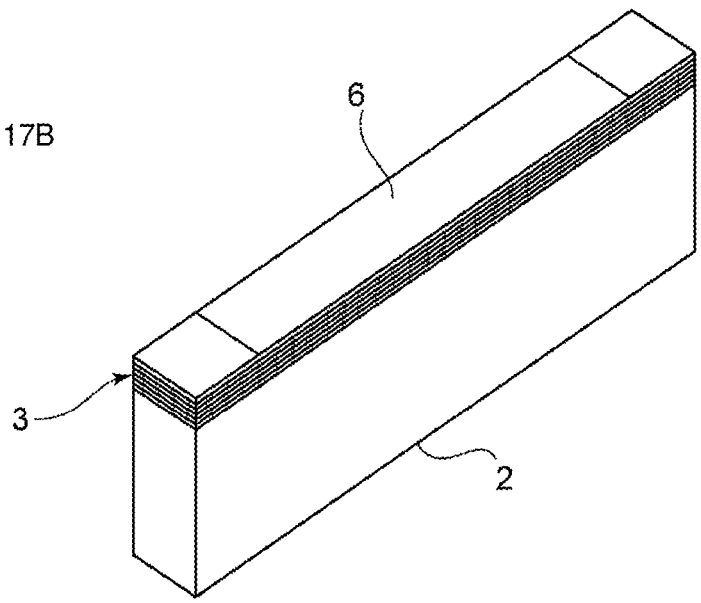
FIG. 17B is a perspective view illustrating a structure of the acoustic wave device of the third preferred embodiment of the present invention in a state where upper electrodes and a piezoelectric body have been removed.

FIG. 17A is a perspective view of an acoustic wave device according to a third preferred embodiment of the present invention, and FIG. 17B is a perspective view illustrating a state where the piezoelectric body and upper electrodes have been removed.

An acoustic wave device 31 includes the support substrate 2 and the acoustic-layer laminated body 3. As in the first preferred embodiment, the acoustic-layer laminated body 3 includes the plurality of low-acoustic-impedance layer 3a, 3c, and 3e and the plurality of high-acoustic-impedance layers 3b, 3d, and 3f. The support substrate 2 is made of Si, for example.

The third preferred embodiment is different from the first preferred embodiment in that the first electrode 5 and a third electrode 32 are disposed on the first main surface 4a of the piezoelectric body 4 made of LiTaO$_3$, the first main surface 4a being located on the side opposite to the acoustic-layer laminated body 3. In other words, the first electrode 5 and the third electrode 32 face each other with a gap therebetween on the first main surface 4a of the piezoelectric body 4. In addition, the second electrode 6 is disposed on the lower surface of the piezoelectric body 4. The second electrode 6 is disposed so as to face the first electrode 5 and the third electrode 32 with the piezoelectric body 4 interposed therebetween.

The azimuth angle of the piezoelectric body 4 is the same as or similar to that in the first preferred embodiment. In this case, a resonator in which thickness shear vibration is excited by the first electrode 5 and the second electrode 6 and a resonator in which thickness shear vibration is excited by the second electrode 6 and the third electrode 32 are connected in series to each other. The present preferred embodiment also corresponds to the structure in which the virtual grooves A and B sandwich the first electrode 5 and the second electrode 6. Thus, the resonance characteristics using the thickness-shear mode may be obtained. Note that the second electrode 6 is not particularly limited to having the size of each of the first and third electrodes 5 and 32 and may be an electrode that has a size covering the entire or substantially the entire acoustic-layer laminated body 3.

Figure 18:
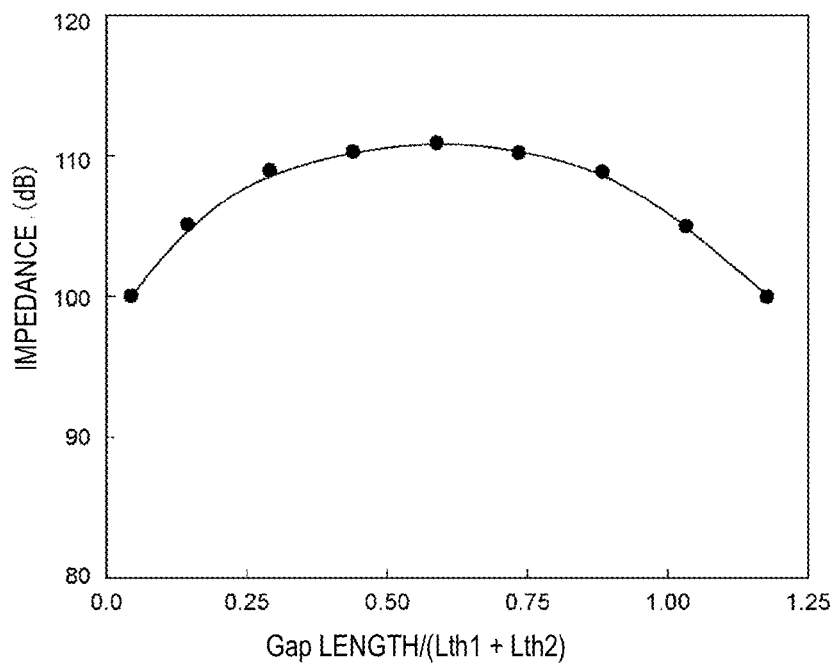
FIG. 18 is a graph illustrating a relationship between Gap length/(Lth1+Lth2) and the impedance ratio of the resonator.

FIG. 18 is a graph illustrating the relationship between Gap length/(Lth1+Lth2) in the acoustic wave device 31 of the third preferred embodiment and the impedance ratio of the resonator. Here, Gap length denotes a distance Gap between the first electrode and the third electrode 32 facing each other, that is, the dimension (Gap length) of the gap between the first electrode 5 and the third electrode 32 in the lengthwise direction of the piezoelectric body 4. The length of each electrode is a dimension of each of the first and third electrodes 5 and 32 and is a dimension (Lth1, Lth2) along the lengthwise direction of the grooves. The length Lth1 and the length Lth2 are not necessarily the same as each other.

As is clear from FIG. 18, when Gap length/(Lth1+Lth2) changes, the impedance ratio of the resonator that is obtained in the resonance characteristics changes. When the length of the gap is denoted by Gap length, it is understood that the impedance ratio of the resonator is about 100 dB or higher when length of gap/length of electrode is about 1.2 or less.

Note that, in the case where each of the electrodes has an irregular shape such as a trapezoidal shape, an elliptical shape, or a polygonal shape, the average value of the electrode lengths parallel or substantially parallel to the groove in the vicinity of the electrode is set as the electrode length, and the average value of the electrode widths perpendicular or substantially perpendicular to the groove in the vicinity of the electrode is set as the electrode width.

In addition, when the length of the gap is denoted by Gap length, it was discovered from the results that, when Gap length/(Lth1+Lth2) is about 0.05 or more and about 1.2 or less, the impedance ratio of the resonator is about 100 dB or higher as illustrated in FIG. 18. The length of the first electrode 5 is denoted by Lth1, and the length of the third electrode 32 is denoted by Lth2. It is preferable that Gap length/(Lth1+Lth2) is about 0.145 or more and about 0.75 or less. In this case, the impedance ratio of the resonator can be about 105 dB or higher. It is more preferable that Gap length/(Lth1+Lth2) is about 0.425 or more and about 0.75 or less. In this case, the impedance ratio of the resonator can be about 110 dB or higher.

When Gap length is small, the capacitive coupling between the first electrode 5 and the third electrode 32 becomes large, and coupling of excitation leaked from the two resonators becomes large, so that the impedance ratio of the resonators becomes low. On the other hand, when Gap length is large, a wiring line connecting the two resonators to each other (a portion of the third electrode 32) is elongated, and thus, the resistance of a wiring portion that does not contribute to excitation increases, so that the impedance ratio of the resonator becomes low. Therefore, by setting Gap length/(Lth1+Lth2) to be within the above range, the impedance ratio of the resonator can be high. Note that a fourth electrode may be disposed on the second main surface of the piezoelectric body so as to face the third electrode. In this case, the first electrode and the second electrode face each other, and the third electrode and the fourth electrode face each other. In addition, a wiring electrode that connects the second electrode and the fourth electrode to each other may be provided. In this case, by setting Gap length/(Lth1+Lth2) to be within the above range, the impedance ratio of the resonator can be high.

Figure 19:
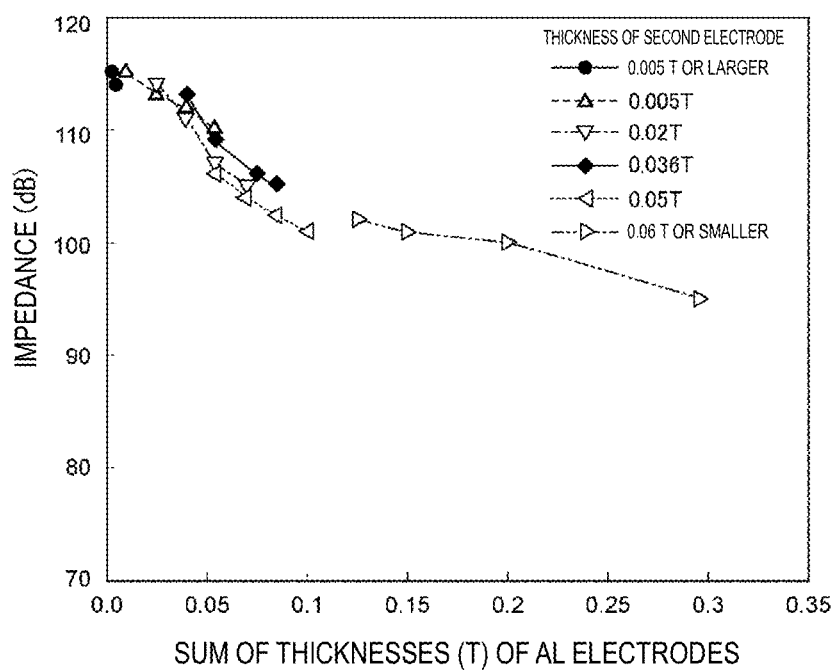
FIG. 19 is a graph illustrating a relationship between the sum of thicknesses (T) of all the electrodes made of Al and the impedance ratio of the resonator.

The thickness of the piezoelectric body 4 is denoted by T, and in the first preferred embodiment, the first electrode 5 is made of an Al layer, and its thickness was varied. FIG. 19 is a graph illustrating the relationship between the sum of the thicknesses of Al electrodes and the impedance ratio of the resonator that is obtained in the resonance characteristics in each of the cases where the thickness of the first electrode 5 is set to about 0.005 T or less, about 0.005 T, about 0.02 T, about 0.036 T, about 0.05 T and about 0.06 T or more. Here, the thickness of the first electrode 5 was varied as described above, and the sum of the thicknesses of the first and second electrodes 5 and 6 was varied.

It is understood from FIG. 19 that, when the sum of the thicknesses of the electrodes made of Al is about 0.2 T or less, the impedance ratio of the resonator is about 100 dB or higher. More preferably, the sum of the thicknesses of the electrodes made of Al may be about 0.085 T or less. In this case, the impedance ratio of the resonator can be about 105 dB or higher. Further preferably, the sum of the thicknesses of the electrodes made of Al may be about 0.05 T or less. In this case, the impedance ratio of the resonator can be about 110 dB or higher.

Note that, although the first and second electrodes 5 and 6 each of which is made of Al have been described, in the case of using electrodes that are not made of Al, the thickness of each of the electrodes may be (density of Al electrode/density of electrode used)×0.2 T or less, for example. The thickness of each of the electrodes is preferably (density of Al electrode/density of electrode used)× about 0.085 T or less and more preferably (density of Al electrode/density of electrode used)×about 0.05 T or less, for example.

Figure 20:
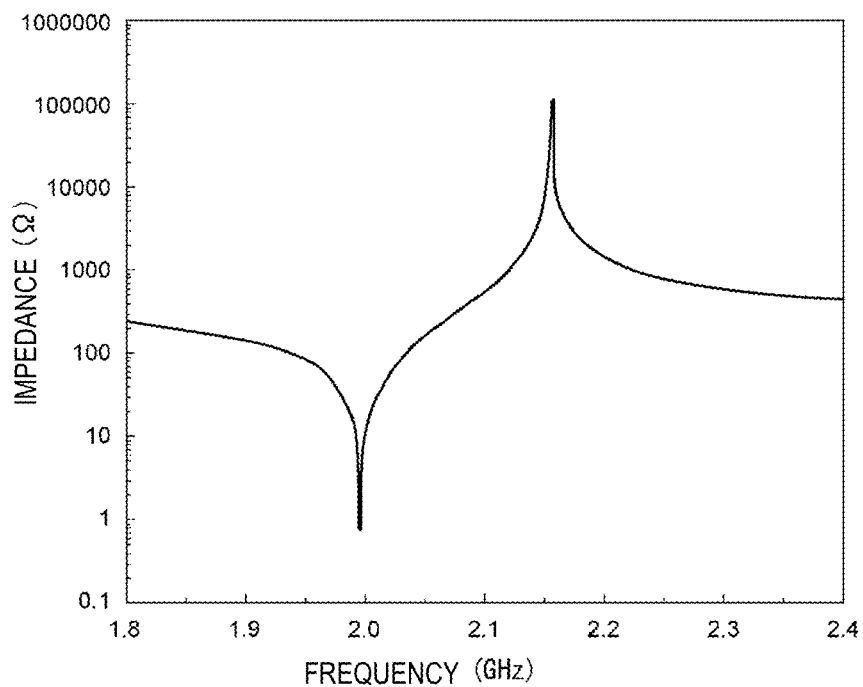
FIG. 20 is a graph illustrating a relationship between the impedance characteristics of the acoustic wave device in the case where an acoustic-layer laminated body is disposed on a first main surface (a positive surface) of the piezoelectric body.

FIG. 5A illustrates the frequency characteristics of the acoustic wave device 1 in the case where the acoustic-layer laminated body 3 is disposed on the side on which the second main surface 4b of the piezoelectric body 4 (i.e., the surface in the negative Z-axis direction of the polarization of the piezoelectric body) and the second electrode 6 are present, and FIG. 20 illustrates the frequency characteristics of the acoustic wave device 1 in the case where the acoustic-layer laminated body 3 is disposed on the side on which the first main surface 4a of the piezoelectric body 4 (i.e., the surface in the positive Z-axis direction of the polarization of the piezoelectric body) is present.

In the case where the acoustic-layer laminated body 3 is located on the side on which the second main surface 4b of the piezoelectric body 4 (i.e., the negative surface of the piezoelectric body) and the second electrode 6 are present, the impedance ratio of the resonator is about 110 dB, and in the case where the acoustic-layer laminated body 3 is located on the side on which the first main surface 4a of the piezoelectric body 4 (i.e., the positive surface of the piezoelectric body) is present, the impedance ratio of the resonator is about 107 dB. Thus, it is preferable that the acoustic-layer laminated body 3 is disposed on the side on which the second main surface 4b of the piezoelectric body 4 (i.e., the negative surface of the piezoelectric body) and the second electrode 6 are present because the impedance ratio of the resonator becomes higher. The surface in the positive Z-axis direction of the polarization of the piezoelectric body 4 is soft, and thus, LiTaO₃ and LiNbO₃ are more likely to vibrate upon application of a voltage thereto when the acoustic-layer laminated body 3 is located on the negative surface than when the acoustic-layer laminated body 3 is located on the positive surface. Therefore, the impedance ratio of the resonator is larger when the acoustic-layer laminate body 3 is located on the negative surface than when the acoustic-layer laminate body 3 is located on the positive surface.

Figure 22:
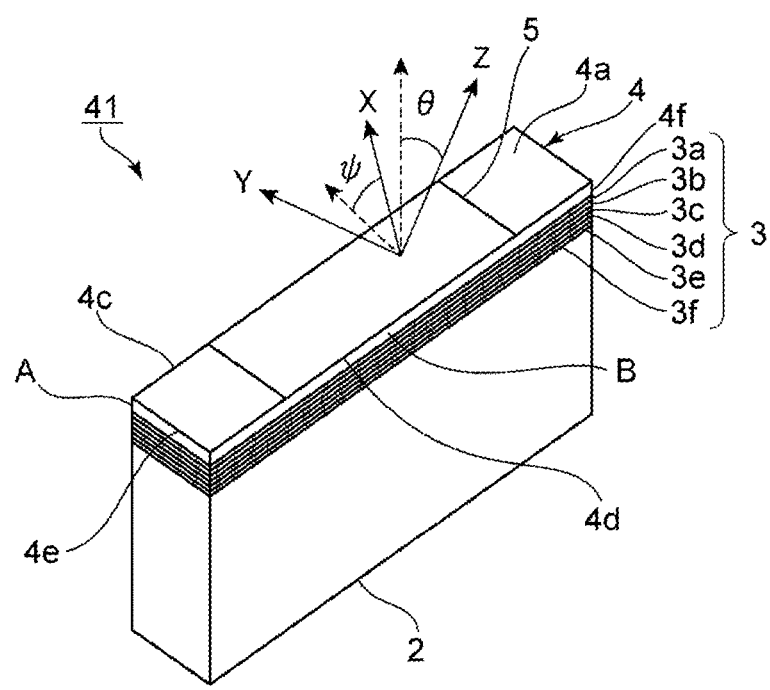
FIG. 22 is a perspective view illustrating a relationship between an acoustic wave device according to a fourth preferred embodiment of the present invention and Euler angles of a piezoelectric body.

Next, an acoustic wave device of a fourth preferred embodiment of the present invention will be described. FIG. 22 is a perspective view of the acoustic wave device of the fourth preferred embodiment, and FIG. 22 also schematically illustrates the relationship between electrodes and Euler angles.

An acoustic wave device 41 is structurally similar to the acoustic wave device 1 illustrated in FIG. 1. Accordingly, components that are the same as or similar to the components of the acoustic wave device 1 are denoted by the same reference numerals, and the acoustic wave device 41 relies on the description of the acoustic wave device 1. In the acoustic wave device 41, the piezoelectric body 4 is made of a LiTaO₃ film. The other materials and the dimensions of the acoustic wave device 41 were set as follows.

Support substrate 2: Si
Acoustic-layer laminated body 3:
  Acoustic layers 3a, 3c, and 3e serving as low-acoustic-impedance layers: Al layers each having a thickness of about 0.34 μm
  Acoustic layers 3b, 3d, and 3f serving as high-acoustic-impedance layers: W layers each having a thickness of about 0.34 μm The piezoelectric body 4 was made of LiTaO₃ so as to have a size of about 150 μm×about 30 μm×thickness of about 1 μm.

Each of the first and second electrodes 5 and 6 was formed so as to have a size of about 90 μm×about 30 μm×thickness about 0.01 μm.

Figure 23A:
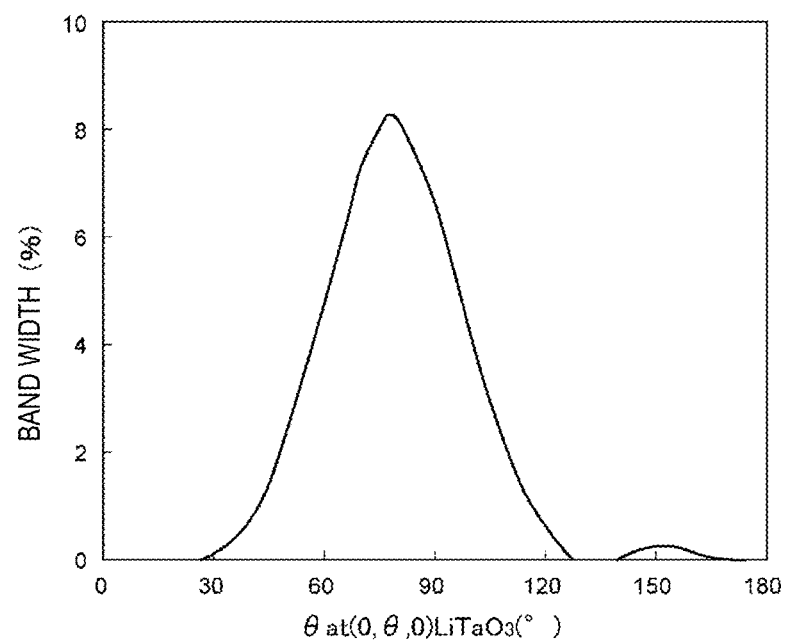
FIG. 23A is a graph illustrating a relationship between θ of Euler angles (about 0°, θ, about 0°) of $LiTaO_3$ in the fourth preferred embodiment of the present invention and band width.
Figure 23B:
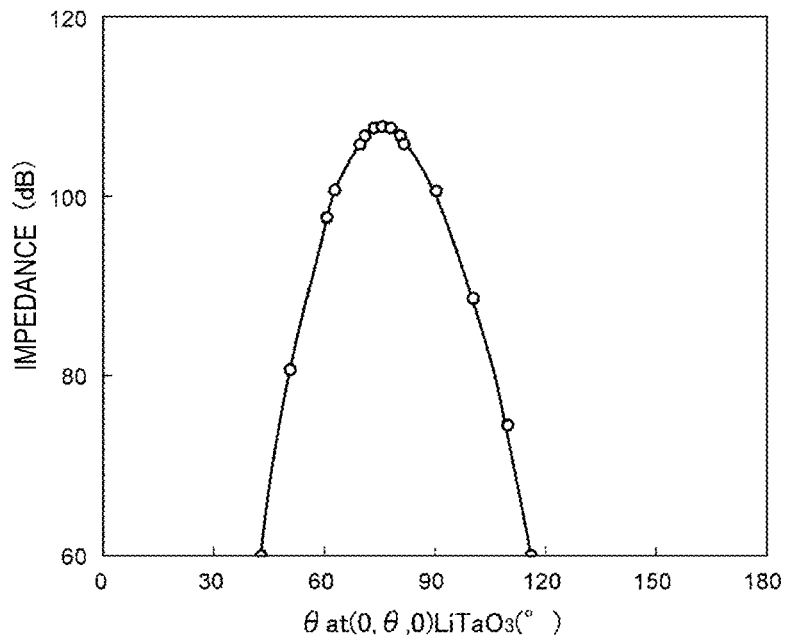
FIG. 23B is a graph illustrating a relationship between θ of Euler angles (about 0°, θ, about 0°) of $LiTaO_3$ in the fourth preferred embodiment and impedance ratio.

The relationship between θ in the case of using LiTaO₃ having Euler angles (0°, θ, 0°) as the piezoelectric body 4 in the above-mentioned acoustic wave device 41 and band width is illustrated in FIG. 23A, and the relationship between θ and impedance ratio is illustrated in FIG. 23B.

When θ is within a range of about 62° or larger and about 90° or smaller, a wide band width and an impedance ratio of about 100 dB or higher are obtained. More preferably, when θ is within a range of about 69° or larger and about 81° or smaller, a wider band width and a higher impedance ratio, which is about 105 dB or higher, are obtained.

Figure 24A:
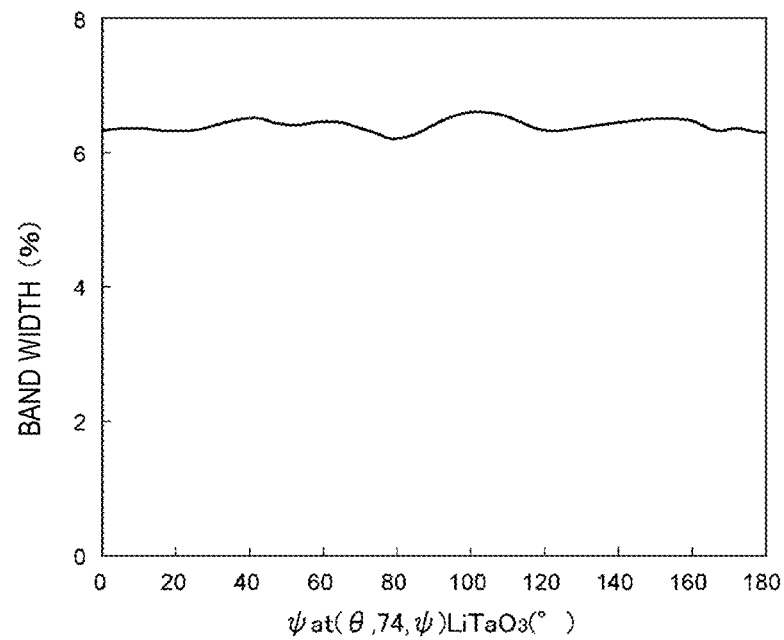
FIG. 24A is a graph illustrating a relationship between ψ of Euler angles (about 0°, about 74°, ψ) of $LiTaO_3$ in the fourth preferred embodiment and band width.
Figure 24B:
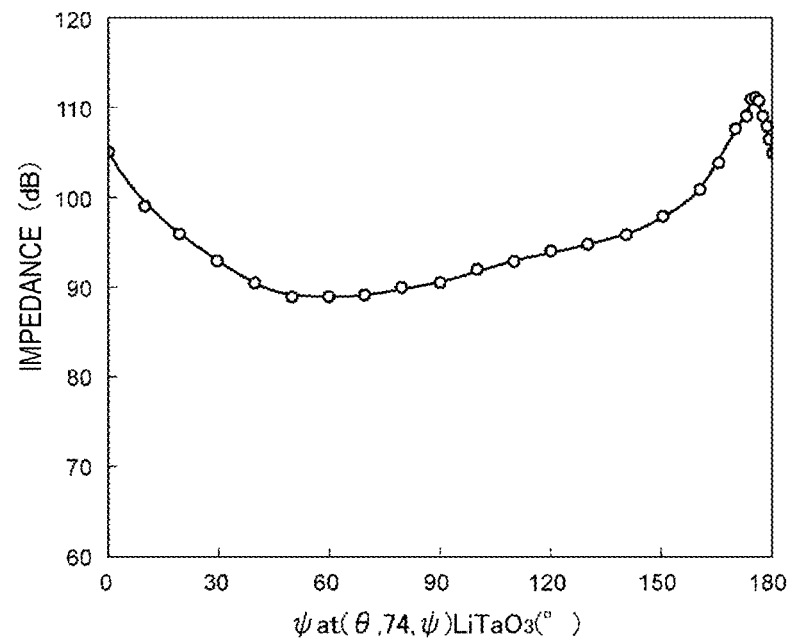
FIG. 24B is a graph illustrating a relationship between iv of Euler angles (about 0°, about 74°, ψ) of $LiTaO_3$ in the fourth preferred embodiment of the present invention and impedance ratio.

FIG. 24A is a graph illustrating the relationship between φ in the case of using LiTaO₃ with (about 0°, about 74°, φ) and a band width of the resonator, and FIG. 24B is a graph illustrating the relationship between φ and impedance ratio. It is understood that the dependence of the band width on φ is small, whereas the impedance ratio has a large dependence on φ. When φ is in a range of about 0° or more and about 3° or less and a range of about 165° or more and about 180° or less, a high impedance ratio of about 100 dB or higher is obtained. More preferably, when φ is in a range of about 170° or more and about 178° or less, a higher impedance ratio of about 105 dB or higher is obtained.

Figure 25A:
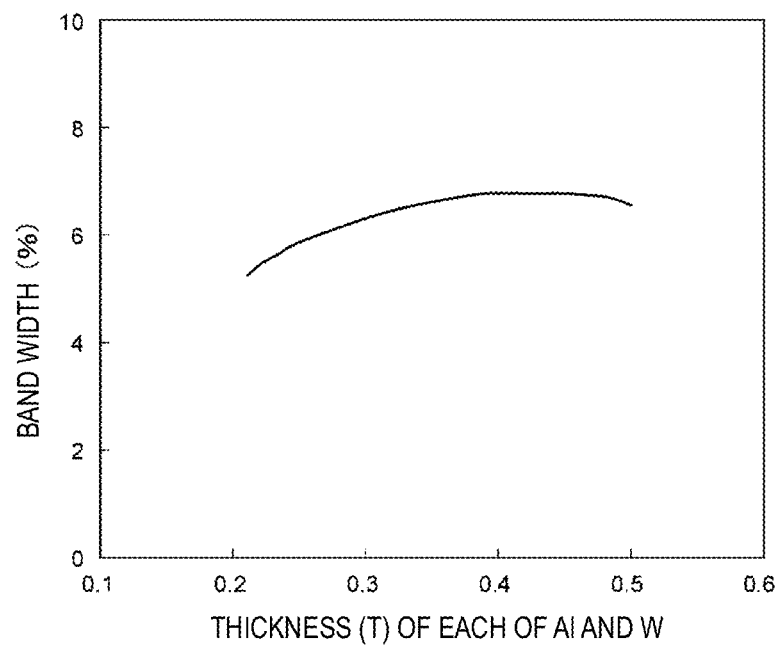
FIG. 25A is a graph illustrating a relationship between the thickness of each of Al and W in the acoustic wave device of the fourth preferred embodiment of the present invention and band width.
Figure 25B:
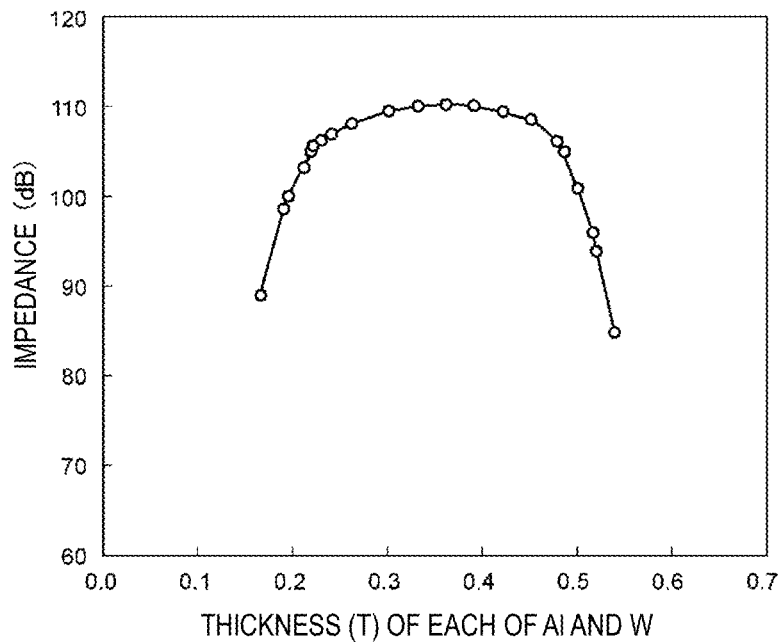
FIG. 25B is a graph illustrating a relationship between the thickness of each of Al and W and impedance ratio.

Next, in the acoustic wave device 41, LiTaO₃ with (about 0°, about 74°, about 175°) was used as the piezoelectric body 4. FIG. 25A is a graph illustrating the relationship between the film thickness of each of Al and W films and band width in the case where the Al layers defining and functioning as the low-acoustic-impedance layers and the W films defining and functioning as the high-acoustic-impedance layers have the same or substantially the same thickness in the acoustic-layer laminated body 3, and FIG. 25B is a graph illustrating the relationship between the thickness of each of the Al and W films and impedance ratio. When the Al films and the W films each had a thickness of about 0.195 T or more and about 0.5 T or less, the impedance ratio was high, which is, about 100 dB or higher. More preferably, when the Al films and the W films each had a thickness of about 0.218 T or more and about 0.486 T or less, the impedance ratio was higher, which is, about 105 dB or higher.

Figure 26A:
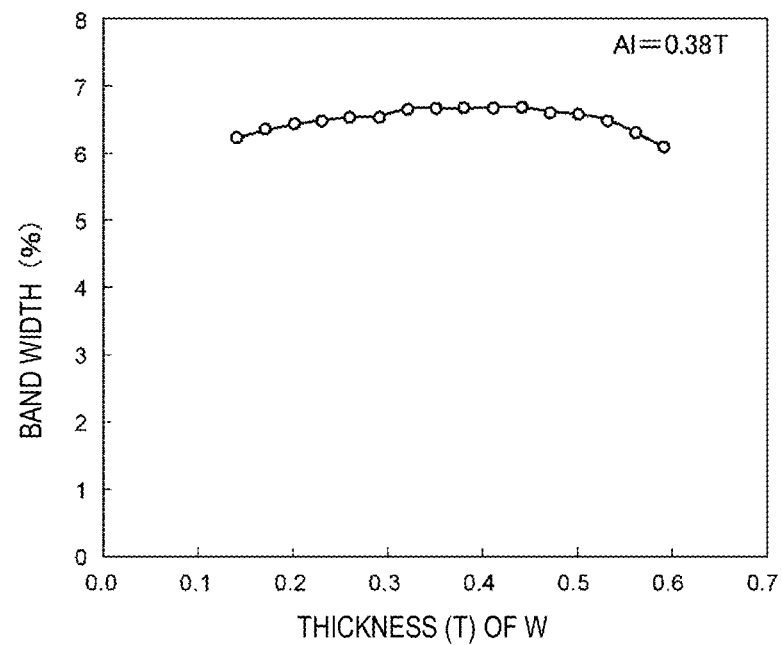
FIG. 26A is a graph illustrating a relationship between the thickness of W in the acoustic wave device of the fourth preferred embodiment of the present invention and band width.
Figure 26B:
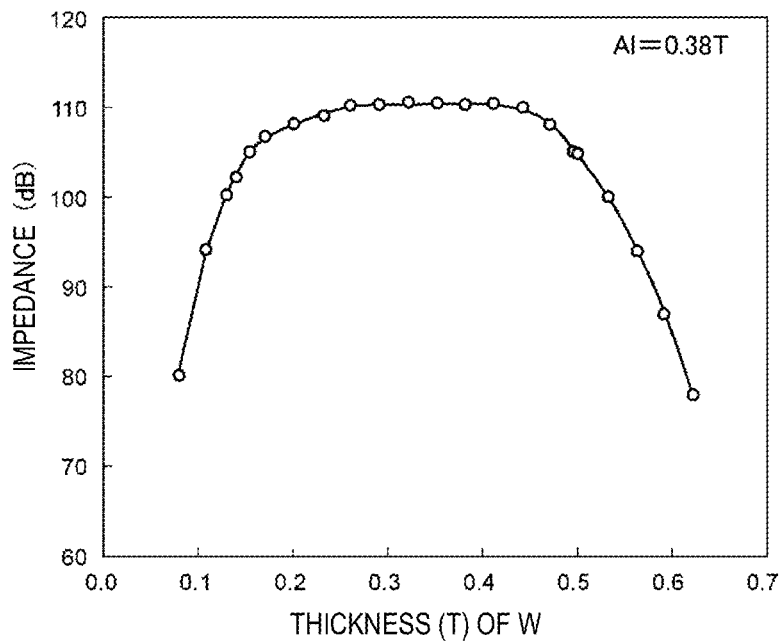
FIG. 26B is a graph illustrating a relationship between the thickness of W and impedance ratio.

FIG. 26A is a graph illustrating the relationship between the thickness of each of the W films defining and functioning as the high-acoustic-impedance layers in the case where LiTaO₃ with (about 0°, about 74°, about 175°) is used and where the Al films defining and functioning as the low-acoustic-impedance layers each have a thickness of about 0.38 T in the acoustic-layer laminated body 3 and band width, and FIG. 26B is a graph illustrating the relationship between the film thickness of each of the W films and impedance ratio. When the thickness of each of the W films was about 0.13 T or more and about 0.53 T or less, the impedance ratio was about 100 dB or higher. More preferably, when the thickness of each of the W films was about 0.152 T or more and about 0.495 T or less, a higher impedance ratio of about 105 dB or higher was obtained.

Figure 27A:
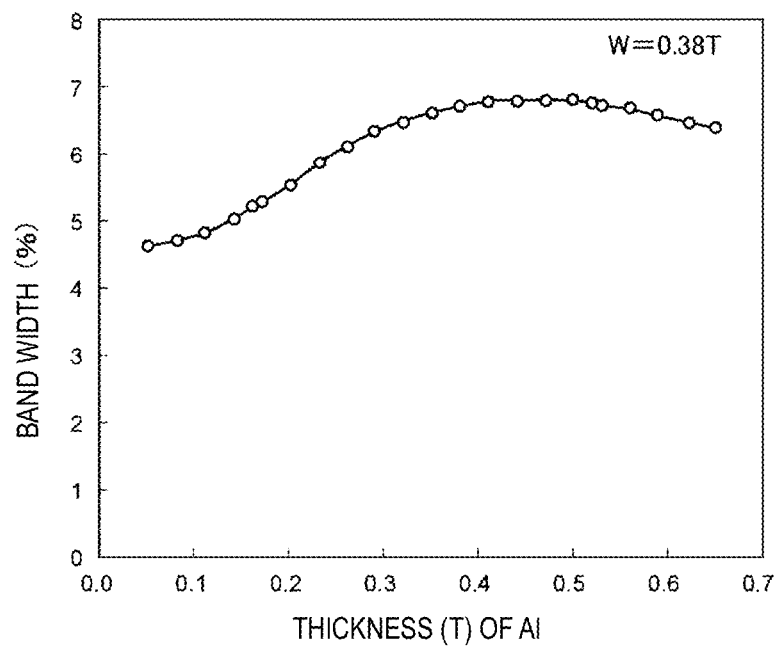
FIG. 27A is a graph illustrating a relationship between the thickness of Al in the acoustic wave device of the fourth preferred embodiment of the present invention and band width.
Figure 27B:
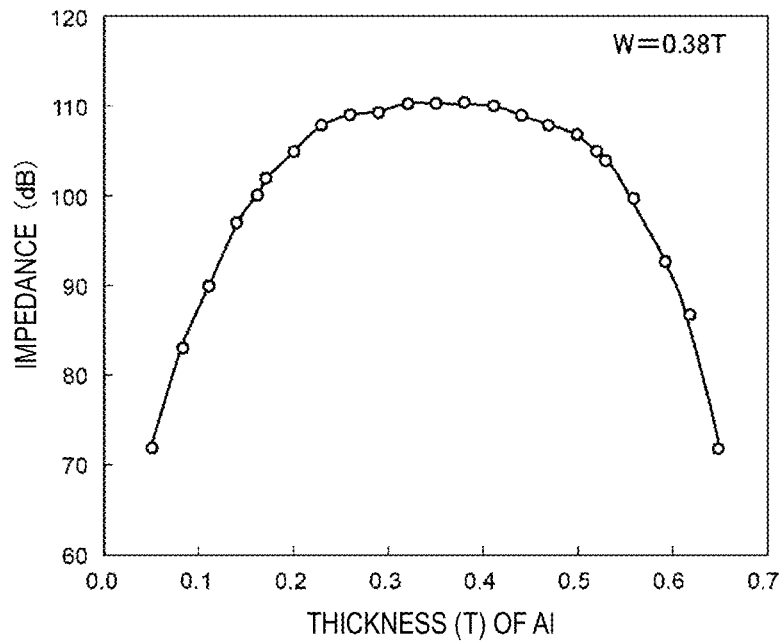
FIG. 27B is a graph illustrating a relationship between the thickness of Al and impedance ratio.

FIG. 27A a graph illustrating the relationship between the thickness of each of the Al films in the case where LiTaO₃ with (about 0°, about 74°, about 175°) is used and where the W films each have a thickness of about 0.38 T and band width, and FIG. 27B is a graph illustrating the relationship between the film thickness of each of the Al films and impedance ratio. When the thickness of each of the Al films was about 0.16 T or more and about 0.56 T or less, the impedance ratio was high, which is, about 100 dB or higher. More preferably, when the thickness of each of the Al films was about 0.20 T or more and about 0.49 T or less, a higher impedance ratio of about 105 dB or higher was obtained.

Note that, in the first to fourth preferred embodiments, although the case in which the low-acoustic-impedance layers are made of Al films and in which the high-acoustic-impedance layer are made of W films has been described as a representative example, similar results may also be obtained in the case of using other materials.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric body including a first main surface and a second main surface facing each other and that is made of $LiTaO_3$;
   a first electrode on the first main surface of the piezoelectric body;
   a second electrode on the second main surface of the piezoelectric body; and
   an acoustic-layer laminated body between the support substrate and the piezoelectric body; wherein
   an azimuth angle of the piezoelectric body is (about 85° to 95°, about 85° to 95°, about 24° to 50°) represented in Euler angles.

2. The acoustic wave device according to claim 1, wherein the azimuth angle of the piezoelectric body is (about 85° to 95°, about 85° to 95°, about 32° to 39°) represented in the Euler angles.

3. The acoustic wave device according to claim 2, further comprising:
   a pair of grooves; wherein
   inner side surfaces of the pair of grooves define and function as side surfaces of the piezoelectric body; and
   the support substrate, the acoustic-layer laminated body, and the piezoelectric body define a laminated structure that has a strip shape and is elongated in a direction parallel or substantially parallel to the pair of grooves.

4. The acoustic wave device according to claim 1, wherein the acoustic-layer laminated body is located on a side on which the second main surface and the second electrodes are located.

5. The acoustic wave device according to claim 1, wherein the acoustic-layer laminated body includes four or more acoustic layers.

6. The acoustic wave device according to claim 5, wherein, when the plurality of acoustic layers are referred to as a first acoustic layer, a second acoustic layer, up to an nth acoustic layer where n is an integer, starting from the acoustic layer closest to the second main surface of the piezoelectric body, odd-numbered acoustic layers each have an acoustic impedance for a longitudinal wave that is lower than an acoustic impedance for a longitudinal wave of each of even-numbered acoustic layers, or the odd-numbered acoustic layers each have an acoustic impedance for a transversal wave that is lower than an acoustic impedance for a transversal wave of each of the even-numbered acoustic layers.

7. The acoustic wave device according to claim 5, wherein, when the thickness of the piezoelectric body is denoted by T, the elastic constant stiffness of each of the acoustic layers is denoted by c33 or c11, and the density of each of the acoustic layers is denoted by $\rho$, and when a longitudinal-wave acoustic impedance is expressed by $(c33 \times \rho)^{1/2}$ or $(c11 \times \rho)^{1/2}$, an acoustic impedance ratio (Zl-low/Zl-high) of the longitudinal-wave acoustic impedance (Zl-low) of each of the odd-numbered acoustic layers to the longitudinal-wave acoustic impedance (Zl-high) of each of the even-numbered acoustic layers is about 0.06 or more and about 0.51 or less.

8. The acoustic wave device according to claim 7, wherein the acoustic impedance ratio (Zl-low/Zl-high) is about 0.06 or more and about 0.32 or less.

9. The acoustic wave device according to claim 5, wherein, when the thickness of the piezoelectric body is denoted by T, the thickness of at least one of the plurality of acoustic layers is set such that the thickness of each of the odd-numbered acoustic layers is about 0.14 T or more and about 0.60 T or less or the thickness of each of the even-numbered acoustic layers is about 0.08 T or more and about 0.56 T or less.

10. The acoustic wave device according to claim 5, wherein, when the thickness of the piezoelectric body is denoted by T, the thickness of at least one of the plurality of acoustic layers is set such that the thickness of each of the odd-numbered acoustic layers is about 0.23 T or more and about 0.48 T or less or the thickness of each of the even-numbered acoustic layers is about 0.19 T or more and about 0.46 T or less.

11. The acoustic wave device according to claim 5, wherein, when the thickness of the piezoelectric body, the elastic constant stiffness of each of the acoustic layers, and the density of each of the acoustic layers are respectively denoted by T, c44, and $\rho$ and a transversal-wave acoustic impedance is expressed by $(c44 \times \rho)^{1/2}$, an acoustic impedance ratio (Zs-low/Zs-high) of the transversal-wave acoustic impedance (Zs-low) of each of the odd-numbered acoustic layers to the transversal-wave acoustic impedance (Zs-high) of each of the even-numbered acoustic layers is about 0.06 or more and about 0.54 or less.

12. The acoustic wave device according to claim 11, wherein the acoustic impedance ratio (Zs-low/Zs-high) is about 0.06 or more and about 0.28 or less.

13. The acoustic wave device according to claim 1, wherein, in at least one of the first electrode and the second electrode, a ratio (Wth/Lth) of a width (Wth) of the first electrode or the second electrode to a length (Lth) of the first electrode or the second electrode is about 3 or less.

14. The acoustic wave device according to claim 1, wherein
   when the thickness of the piezoelectric body that is a dimension of the piezoelectric body in a direction connecting the first main surface and the second main surface of the piezoelectric body is denoted by T, the first electrode and the second electrode are Al electrodes, and a sum of a thickness of the first electrode and a thickness of the second electrode is about 0.2 T or less; and
   when the first electrode and the second electrode are metal electrodes other than Al electrodes, a sum of the thicknesses of the electrodes facing each other is (density of Al electrode/density of electrode used)×about 0.2 T or less.

15. The acoustic wave device according to claim 1, further comprising:
   a third electrode on the first main surface;
   a fourth electrode on the second main surface and that faces the third electrode; and
   a wiring electrode connecting the second electrode and the fourth electrode to each other; wherein
   when a length of the first electrode in a direction connecting the first electrode and the third electrode, a length of the third electrode in the direction connecting the first electrode and the third electrode, and a length of a gap between the first electrode and the third electrode are respectively denoted by Lth1, Lth2, and Gap length, Gap length/(Lth1+Lth2) is about 0.05 or more and about 1.2 or less.

16. An acoustic wave device comprising:
   a support substrate;

a piezoelectric body including a first main surface and a second main surface facing each other and that is made of $LiTaO_3$;

a first electrode on the first main surface of the piezoelectric body;

a second electrode on the second main surface of the piezoelectric body; and an acoustic-layer laminated body between the support substrate and the piezoelectric body; wherein the acoustic wave device uses a thickness shear vibration;

an azimuth angle of the piezoelectric body is (about −10° to 10°, about 62° to 90°, about 0° to 3°) or (about −10° to 10°, about 62° to 90°, about 165° to 180°) represented in Euler angles;

the acoustic-layer laminated body includes a low-acoustic-impedance layer and a high-acoustic-impedance layer with an acoustic impedance for a longitudinal wave or a transversal wave higher than an acoustic impedance of the low-acoustic-impedance layer; and when a thickness of the piezoelectric body is denoted by T and the low-acoustic-impedance layer and the high-acoustic-impedance layer have approximately the same thickness, the thickness of each of the layers is about 0.195 T to about 0.5 T.

17. The acoustic wave device according to claim 16, wherein the azimuth angle of the piezoelectric body is (about −10° to 10°, about 62° to 90°, about 170° to 178°), (about −10° to 10°, about 69° to 81°, about 0° to 3°), or (about −10° to 10°, about 69° to 81°, about 165° to 180°) represented in the Euler angles.

18. The acoustic wave device according to claim 16, wherein the azimuth angle of the piezoelectric body is (about −10° to 10°, about 69° to 81°, about 170° to 178°) represented in the Euler angles.

19. The acoustic wave device according to claim 16, further comprising:

a pair of grooves; wherein inner side surfaces of the pair of grooves define and function as side surfaces of the piezoelectric body; and the support substrate, the acoustic-layer laminated body, and the piezoelectric body define a laminated structure that has a strip shape and is elongated in a direction parallel or substantially parallel to the pair of grooves.

20. An acoustic wave device comprising:

a support substrate;

a piezoelectric body including a first main surface and a second main surface facing each other and that is made of $LiNbO_3$;

a first electrode on the first main surface of the piezoelectric body;

a second electrode on the second main surface of the piezoelectric body; and an acoustic-layer laminated body between the support substrate and the piezoelectric body; wherein an azimuth angle of the piezoelectric body is (−10° to 10°, −121° to −77°, 0° to 45°) or (−10° to 10°, −121° to −77°, −140° to 180°) represented in Euler angles.

21. The acoustic wave device according to claim 20, wherein the azimuth angle of the piezoelectric body is (−10° to 10°, −106° to −87°, 0° to 26°) or (−10° to 10°, −106° to −87°, 165° to 180°) in the Euler angles.

22. The acoustic wave device according to claim 20, wherein the azimuth angle of the piezoelectric body is (−10° to 10°, −104° to −90°, 0° to 20°) or (−10° to 10°, −104° to −90°, 167° to 180°) in the Euler angles.

* * * * *